United States Patent
Nakaiso et al.

(10) Patent No.: US 7,883,581 B2
(45) Date of Patent: Feb. 8, 2011

(54) SUBSTRATE PROCESSING APPARATUS AND METHOD OF MANUFACTURING SEMICONDUCTOR DEVICE

(75) Inventors: Naoharu Nakaiso, Toyama (JP); Kiyohiko Maeda, Imizu (JP); Masayuki Yamada, Toyama (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 77 days.

(21) Appl. No.: 12/421,117

(22) Filed: Apr. 9, 2009

(65) Prior Publication Data

US 2009/0258504 A1   Oct. 15, 2009

(30) Foreign Application Priority Data

Apr. 14, 2008   (JP)   ............................. 2008-104559

(51) Int. Cl.
 *C23C 16/52* (2006.01)
 *C23C 16/56* (2006.01)
 *C23F 1/00* (2006.01)
 *H01L 21/306* (2006.01)
 *C23C 16/06* (2006.01)
 *C23C 16/22* (2006.01)

(52) U.S. Cl. .................... 118/715; 118/728; 118/697; 118/696; 156/345.24; 156/345.26

(58) Field of Classification Search .................. 118/715, 118/728, 697, 696; 156/345.24, 345.26
See application file for complete search history.

(56) References Cited

U.S. PATENT DOCUMENTS

| | | | | |
|---|---|---|---|---|
| 4,166,784 A | * | 9/1979 | Chapin et al. | 204/192.13 |
| 4,793,283 A | * | 12/1988 | Sarkozy | 118/725 |
| 5,088,922 A | * | 2/1992 | Kakizaki et al. | 432/152 |
| 5,324,540 A | * | 6/1994 | Terada | 427/255.5 |
| 5,460,654 A | * | 10/1995 | Kikkawa et al. | 118/726 |
| 5,484,484 A | * | 1/1996 | Yamaga et al. | 118/719 |
| 5,565,038 A | * | 10/1996 | Ashley | 134/2 |
| 5,575,853 A | * | 11/1996 | Arami et al. | 118/708 |
| 5,753,891 A | * | 5/1998 | Iwata et al. | 219/390 |
| 5,777,300 A | * | 7/1998 | Homma et al. | 219/679 |
| 5,789,024 A | * | 8/1998 | Levy et al. | 427/244 |
| 5,935,337 A | * | 8/1999 | Takeuchi et al. | 118/724 |
| 6,022,483 A | * | 2/2000 | Aral | 216/59 |
| 6,197,123 B1 | * | 3/2001 | Poag et al. | 134/18 |

(Continued)

FOREIGN PATENT DOCUMENTS

JP   2001-217194   8/2001

(Continued)

*Primary Examiner*—Rudy Zervigon

(57) ABSTRACT

Provided are a substrate processing apparatus and a method of manufacturing a semiconductor device. The substrate processing apparatus includes a reaction vessel configured to process a substrate, a heater configured to heat an inside of the reaction vessel, a gas supply line configured to supply gas into the reaction vessel, a first valve installed at the gas supply line, a flow rate controller installed at the gas supply line, a main exhaust line configured to exhaust the inside of the reaction vessel, a second valve installed at the main exhaust line, a slow exhaust line installed at the main exhaust line, a third valve installed at the slow exhaust line, a throttle part installed at the slow exhaust line, a vacuum pump installed at the main exhaust line, and a controller configured to control the valves and the flow rate controller.

11 Claims, 11 Drawing Sheets

U.S. PATENT DOCUMENTS

| | | | |
|---|---|---|---|
| 6,283,175 B1* | 9/2001 | Shimazu | 141/98 |
| 6,419,984 B1* | 7/2002 | Chang | 427/248.1 |
| 6,432,838 B1* | 8/2002 | Choi et al. | 438/758 |
| 6,524,650 B1* | 2/2003 | Shimahara et al. | 427/248.1 |
| 6,562,109 B2* | 5/2003 | Livingston et al. | 95/270 |
| 6,589,023 B2* | 7/2003 | Royce et al. | 417/251 |
| 6,664,119 B2* | 12/2003 | Choi et al. | 438/14 |
| 6,927,112 B2* | 8/2005 | Igeta et al. | 438/200 |
| 6,936,108 B1* | 8/2005 | Saito | 118/715 |
| 7,179,334 B2* | 2/2007 | Sakamoto et al. | 118/668 |
| 7,604,010 B2* | 10/2009 | Hasebe et al. | 134/1.1 |
| 7,615,120 B2* | 11/2009 | Shajii et al. | 118/666 |
| 7,829,353 B2* | 11/2010 | Shajii et al. | 438/5 |
| 2002/0007790 A1* | 1/2002 | Park | 118/715 |
| 2002/0052097 A1* | 5/2002 | Park | 438/507 |
| 2002/0094689 A1* | 7/2002 | Park | 438/694 |
| 2003/0036272 A1* | 2/2003 | Shamouilian et al. | 438/691 |
| 2003/0101938 A1* | 6/2003 | Ronsse et al. | 118/726 |
| 2004/0002170 A1* | 1/2004 | Shimizu et al. | 438/5 |
| 2005/0189074 A1* | 9/2005 | Kasai et al. | 156/345.33 |
| 2005/0249876 A1* | 11/2005 | Kawahara et al. | 427/255.34 |
| 2006/0057799 A1* | 3/2006 | Horiguchi et al. | 438/200 |
| 2006/0156979 A1* | 7/2006 | Thakur et al. | 118/715 |
| 2006/0156980 A1* | 7/2006 | Won et al. | 118/715 |
| 2009/0258504 A1* | 10/2009 | Nakaiso et al. | 438/758 |

FOREIGN PATENT DOCUMENTS

| | | |
|---|---|---|
| JP | 2001-230248 | 8/2001 |
| JP | 2004-241566 | 8/2004 |

* cited by examiner

Fig. 11

| Orifice Diameter (mm) | < 5 slm | | 5 slm ≤ & ≤ 30 slm | | 30 slm < & < 100 slm | | 100 slm ≤ | |
|---|---|---|---|---|---|---|---|---|
| | Back Diffusion | Floating | Back Diffusion | Floating | Back Diffusion | Floating | Back Diffusion | Floating |
| < Ø 1.0 | X | O | X | O | X | X | X | X |
| Ø 1.0 | X | O | O | O | O | X | O | X |
| Ø 1.5 | X | O | O | O | O | X | O | X |
| Ø 3.0 | X | O | O | O | O | X | O | X |
| > Ø 3.0 | X | O | X | O | X | X | O | X |

O ... back diffusion does not occur, floating does not occur

X ... back diffusion occurs, floating occurs

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2008-104559, filed on Apr. 14, 2008, in the Japanese Patent Office, the entire contents of which are hereby incorporated by reference.

BACKGROUND OF THE INVENTION

1. Field of the Invention

The present invention relates to a substrate processing apparatus for forming a thin film on a substrate and a method of manufacturing a semiconductor device.

2. Description of the Prior Art

In the related art, a substrate processing apparatus such as a vertical chemical vapor deposition (CVD) apparatus is used to form a thin film on a substrate such as a silicon wafer. The vertical CVD apparatus includes a reaction vessel for processing a substrate, a gas supply line for supplying process gas to the inside of the reaction vessel, and a main exhaust line for exhausting the inside of the reaction vessel.

In a substrate processing method using the vertical CVD apparatus, after carrying a substrate into the reaction vessel, the substrate is processed by supplying process gas to the inside of the reaction vessel while exhausting the inside of the reaction vessel through the main exhaust line, and then the processed substrate is carried out of the reaction vessel.

In the substrate processing method, if the process gas includes vaporized BTBAS (bis(tertiary-butylamino)silane, $SiH_2[NH(C_4H_9)]_2$) and ammonia gas ($NH_3$), a silicon nitride ($Si_3N_4$) film may be formed on the substrate (for example, refer to Patent document 1 below).

[Patent Document 1] Japanese Unexamined Patent Application Publication No. 2001-230248.

When a substrate is processed according to the above-described substrate processing method, byproducts may be deposited inside the main exhaust line, and the deposited byproducts and their components may flow back into the reaction vessel and adsorb on the substrate accommodated in the reaction vessel to cause problems such as generation of particles (contaminants). If semiconductor devices are fabricated using a substrate on which contaminants are adsorbed, the performance, lifespan, or manufacturing yield of the semiconductor devices is decreased. Generation of contaminants is not limited to the above-described case, for example, contaminants can be generated due to gas phase reaction of process gas in the main exhaust line.

In a method proposed to remove such problems, when carrying a substrate into or out of the reaction vessel or changing the inside of the reaction vessel from vacuum state into atmospheric pressure state, a small amount of gas is exhausted (slow pumping is executed) through the main exhaust line and a slow exhaust line installed in parallel with the main exhaust line so as to prevent backflow of byproducts and their components.

However, although such a method is used, fine contaminants having a particle diameter of 0.1 μm or less are generated to a several hundred level. Therefore, improved contamination preventing technology is necessary to cope with such situations and future miniaturization of semiconductor devices.

SUMMARY OF THE INVENTION

An object of the present invention is to provide a substrate processing apparatus and a method of manufacturing a semiconductor device that are designed to prevent byproducts and their components from flowing back from a main exhaust line to the inside of a reaction vessel, and to suppress generation of fine contaminants having a small particle size on a substrate.

According to an aspect of the present invention, there is provided a substrate processing apparatus including: a reaction vessel configured to process a substrate; a heater configured to heat an inside of the reaction vessel; a gas supply line configured to supply gas to the inside of the reaction vessel; a first valve installed at the gas supply line; a flow rate controller installed at the gas supply line for controlling a gas supply flow rate; a main exhaust line configured to exhaust the inside of the reaction vessel; a second valve installed at the main exhaust line; a slow exhaust line installed at the main exhaust line for bypassing the second valve; a third valve installed at the slow exhaust line; a throttle part installed at the slow exhaust line for throttling a gas flow path of the slow exhaust line; a vacuum pump installed at the main exhaust line for evacuating the inside of the reaction vessel; and a controller configured to control the valves and the flow rate controller during a period where the substrate is not processed, so as to exhaust the inside of the reaction vessel through the slow exhaust line using the vacuum pump while supplying inert gas to the inside of the reaction vessel at a flow rate higher than a total flow rate of gas supplied to the inside of the reaction vessel during a substrate processing operation.

According to another aspect of the present invention, there is provided a substrate processing apparatus including: a reaction vessel configured to process a substrate; a heater configured to heat an inside of the reaction vessel; a gas supply line configured to supply gas to the inside of the reaction vessel; a first valve installed at the gas supply line; a flow rate controller installed at the gas supply line for controlling a gas supply flow rate; a main exhaust line configured to exhaust the inside of the reaction vessel; a second valve installed at the main exhaust line; a slow exhaust line installed at the main exhaust line for bypassing the second valve; a third valve installed at the slow exhaust line; an orifice installed at the slow exhaust line and including a hole having a diameter in a range from 1 mm to 3 mm, the hole forming a gas flow path; a vacuum pump installed at the main exhaust line for evacuating the inside of the reaction vessel; and a controller configured to control the valves and the flow rate controller during a period where the substrate is not processed, so as to exhaust the inside of the reaction vessel through the slow exhaust line using the vacuum pump while supplying inert gas to the inside of the reaction vessel at a flow rate of 5 slm to 30 slm.

According to another aspect of the present invention, there is provided a method of manufacturing a semiconductor device, including: carrying a substrate into a reaction vessel of a substrate processing apparatus; processing the substrate by supplying process gas to an inside of the reaction vessel while exhausting the inside of the reaction vessel through a main exhaust line using a vacuum pump; carrying the processed substrate from the reaction vessel; and operating the substrate processing apparatus in an idle mode until another substrate is carried into the reaction vessel for next processing, wherein during a period where the processing of the substrate is not performed, the inside of the reaction vessel is exhausted using the vacuum pump through a slow exhaust line, which is installed at the main exhaust line in parallel and including a throttle part for throttling a gas flow path, while supplying inert gas to the inside of the reaction vessel at a flow rate higher than a total flow rate of gas supplied to the inside of the reaction vessel during the processing of the substrate.

BRIEF DESCRIPTION OF THE DRAWINGS

FIG. 10A illustrates the case where a pipe heater is installed at the upstream side of a main exhaust valve of a main exhaust line and the upstream side of an orifice of a slow exhaust line; and FIG. 10B illustrates the case where the pipe heater is installed along the entire lengths of the main exhaust line and the slow exhaust line.

FIG. 11 is a graph illustrating evaluation results relevant to Example 2.

DETAILED DESCRIPTION OF THE PREFERRED EMBODIMENTS

As described above, in a conventional method, when carrying a substrate into or out of a reaction vessel or changing the inside of the reaction vessel from vacuum state into atmospheric pressure state, a small amount of gas is exhausted (slow pumping is executed) through a main exhaust line and a slow exhaust line. However, although such a method is used, it is difficult to sufficiently suppress generation of fine contaminants having a particle diameter of 0.1 μm or less.

Therefore, the backflow mechanism of byproducts and their components from the main exhaust line has been assiduously studied by the inventors. As a result of the study, the inventors found that phenomena such backflow of byproducts and their components occur when a substrate processing apparatus is idle, that is, from the time when a processed substrate is carried out from a reaction vessel to the time when the next substrate is carried into the reaction vessel. The present invention is based on such knowledge of the inventors.

Hereinafter, a vertical chemical vapor deposition (CVD) apparatus will be described as a substrate processing apparatus relevant to an embodiment of the present invention, and a substrate processing method using the CVD apparatus will be described as one process of processes of manufacturing a semiconductor device.

(1) Structure of Vertical CVD Apparatus

Figure 1:
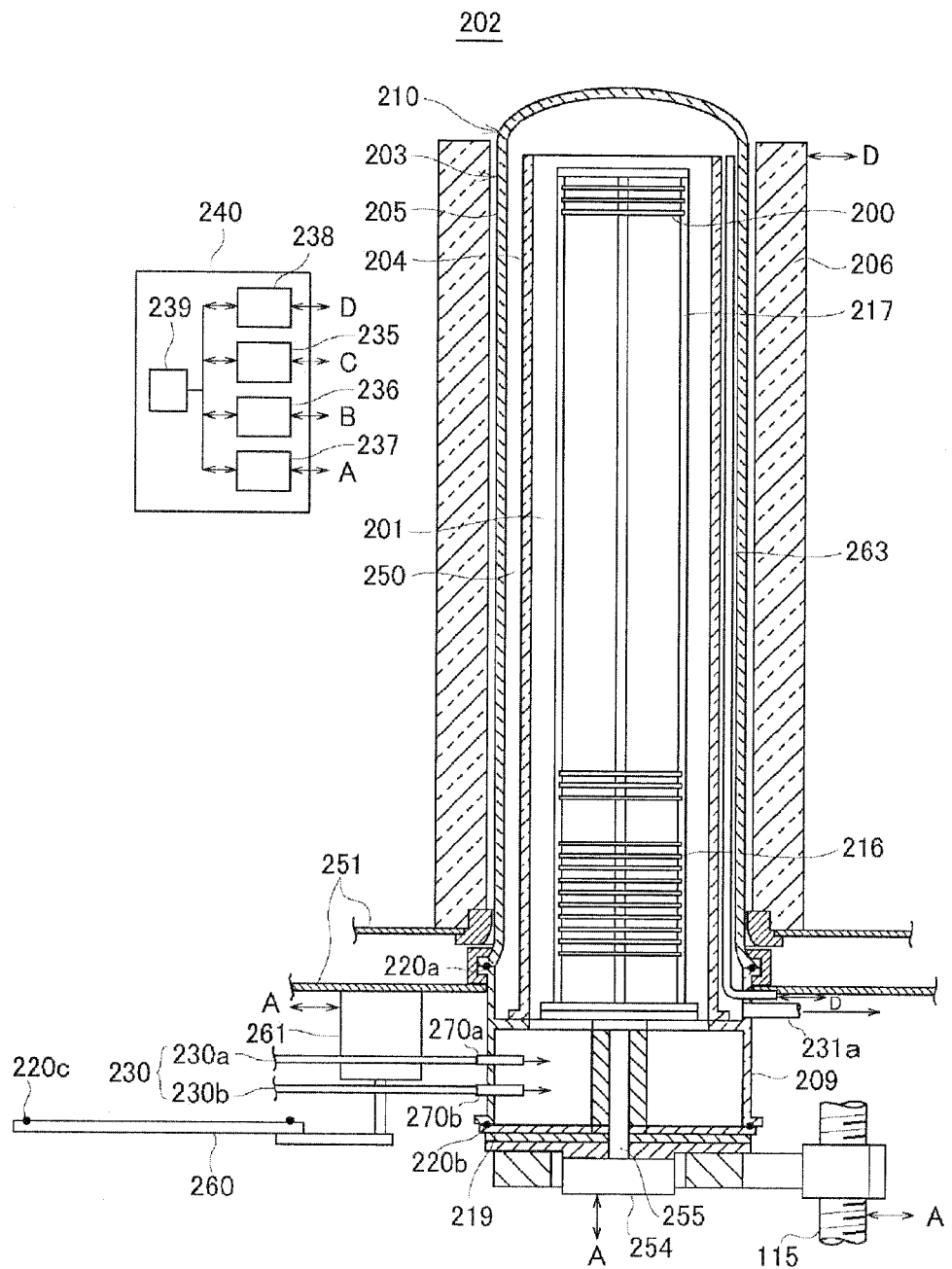
FIG. 1 is a schematic view illustrating a vertical chemical vapor deposition (CVD) apparatus as a substrate processing apparatus relevant to an embodiment of the present invention, in which a reaction vessel accommodating a boat in which substrates are supported is closed by a seal cap.
Figure 2:
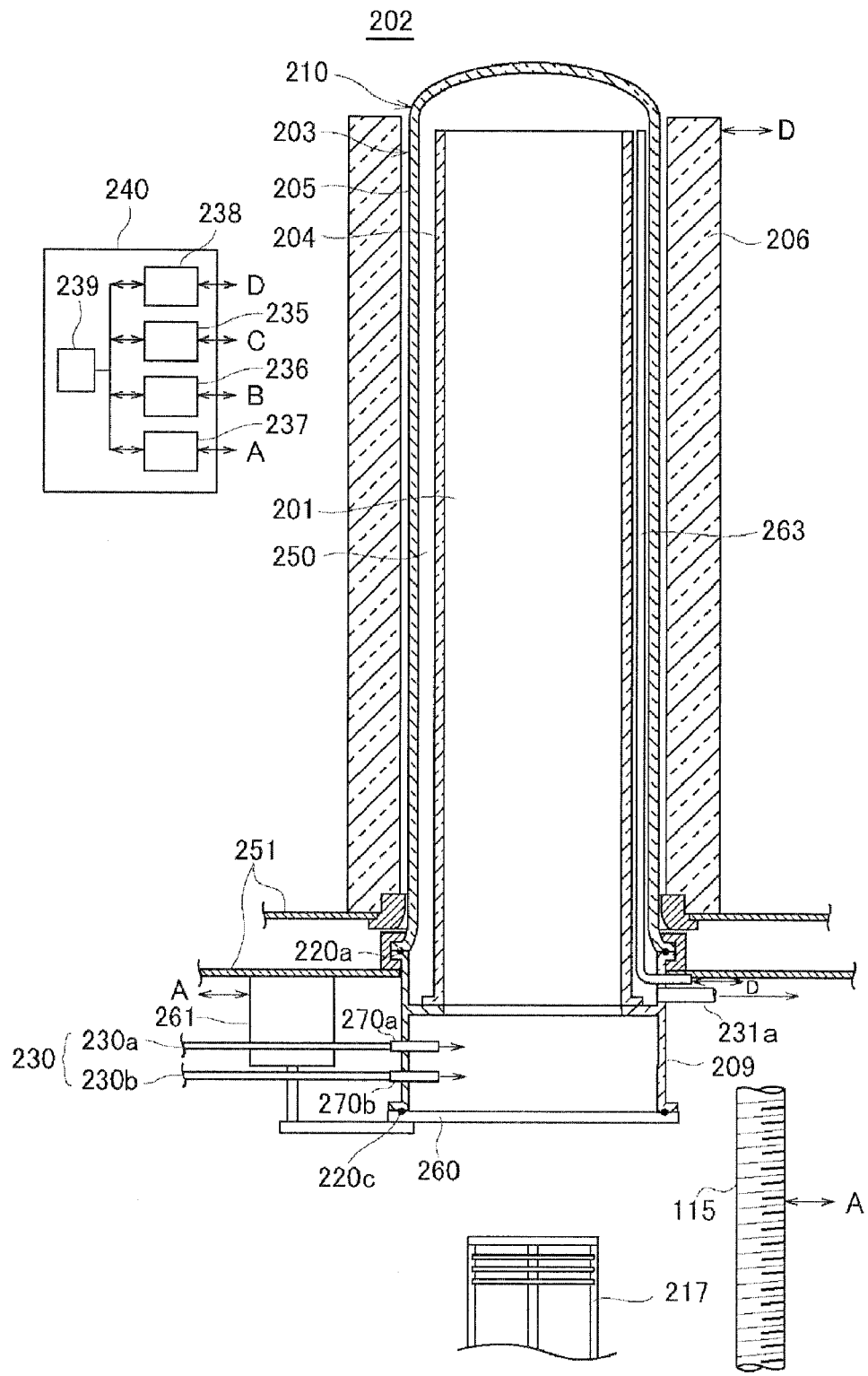
FIG. 2 is a schematic view illustrating the vertical CVD apparatus as a substrate processing apparatus relevant to an embodiment of the present invention, in which a shutter is used to close the reaction vessel when the reaction vessel does not accommodate the boat.
Figure 3:
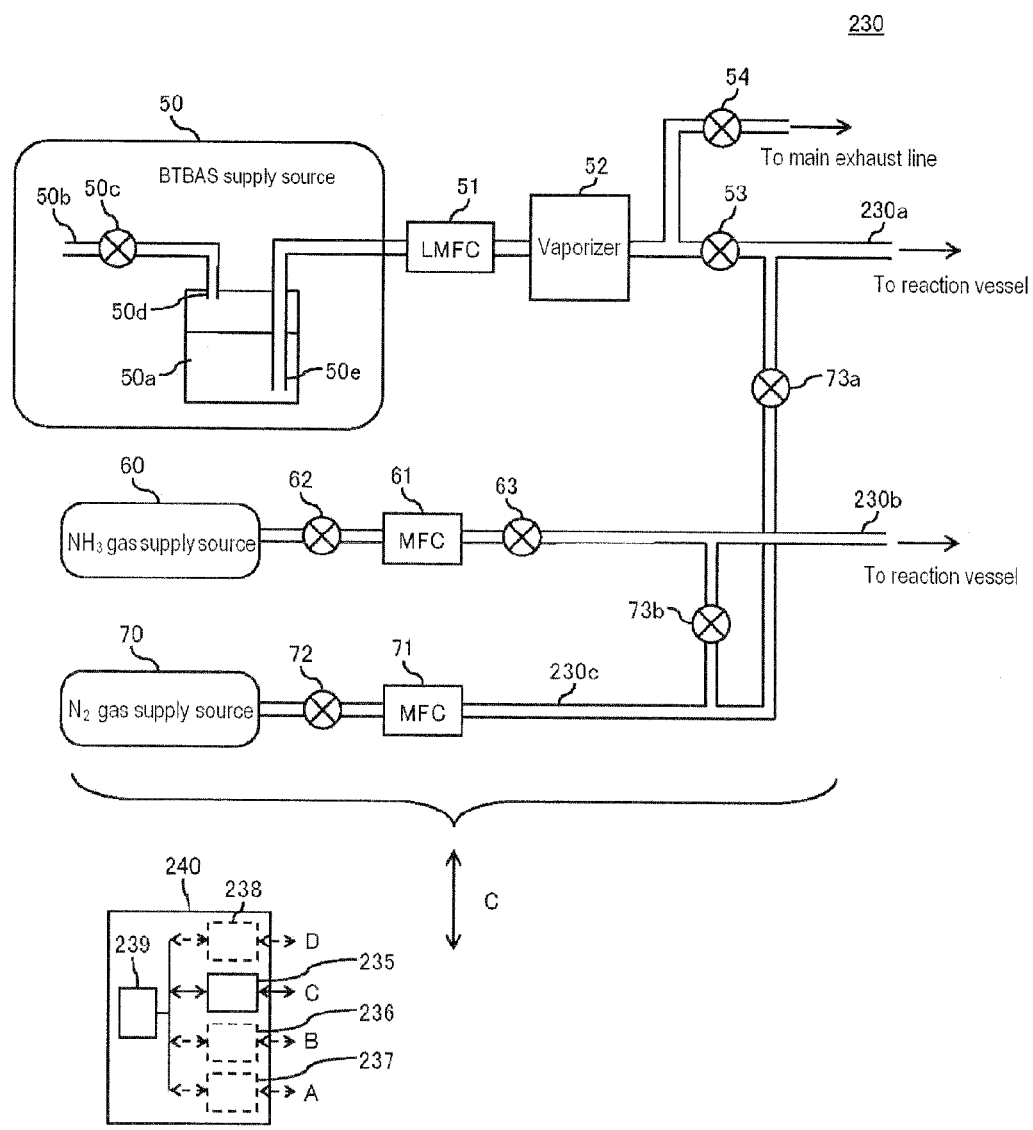
FIG. 3 is a schematic view illustrating gas supply lines as a gas supply system of a vertical CVD apparatus which is a substrate processing apparatus relevant to an embodiment of the present invention.

Hereinafter, as a substrate processing apparatus relevant to an embodiment of the present invention, a vertical CVD apparatus will be described with reference to the attached drawings. FIG. 1 and FIG. 2 are schematic views (vertical sectional views) illustrating a vertical CVD apparatus relevant to an embodiment of the present invention. FIG. 1 illustrates a state where a seal cap is used to close a reaction vessel accommodating a boat in which substrates are supported, and FIG. 2 illustrates a state where a shutter is used to close the reaction vessel when the reaction vessel does not accommodate the boat (that is, after the boat is unloaded from the reaction vessel). FIG. 3 is a schematic view illustrating gas supply lines as a gas supply system of a vertical CVD apparatus relevant to an embodiment of the present invention. FIG. 4 is a schematic view illustrating gas exhaust lines including a main exhaust line and a slow exhaust line, as a gas exhaust system of a vertical CVD apparatus relevant to an embodiment of the present invention.

[Reaction Vessel]

Referring to FIG. 1, as a substrate processing apparatus relevant to an embodiment of the present invention, the vertical CVD apparatus includes a reaction vessel 210 configured to process substrates such as wafers 200. The reaction vessel 210 includes a process tube 203 and a manifold 209.

The process tube 203 includes an inner tube 204 as an inner reaction tube, and an outer tube 205 as an outer reaction tube coaxially installed around the inner tube 204. The inner tube 204 and the outer tube 205 are vertically installed. For example, the inner tube 204 is made of a heat resistant material such as quartz ($SiO_2$) or silicon carbide (SiC) and has a cylindrical shape with opened top and bottom sides. A process chamber 201 is formed in a hollow part of the inner tube 204. For example, the outer tube 205 is made of a heat resistant material such as quartz ($SiO_2$) or silicon carbide (SiC) and has an inner diameter greater than the outer diameter of the inner tube 204 The outer tube 205 has a cylindrical shape with a closed top side and an opened bottom side.

The manifold 209 is installed under and coaxially with the outer tube 205. For example, the manifold 209 is made of a material such as stainless steel and has a cylindrical shape with opened top and bottom sides. The manifold 209 is engaged with the bottom sides of the inner tube 204 and the outer tube 205 and configured to support the inner tube 204 and the outer tube 205. Between the manifold 209 and the outer tube 205, an O-ring 220a is installed as a seal member.

[Heater and Temperature Sensor]

At the outside of the process tube 203, a heater 206 is installed coaxially with the process tube 203 as a heating mechanism to heat the inside of the process chamber 201. The heater 206 has a cylindrical shape and is supported by a heater base 251 used as a supporting plate. The heater base 251 also supports the manifold 209.

Inside the process tube 203, a temperature sensor 263 is installed as a temperature detector. A temperature control unit 238 is electrically connected to the heater 206 and the temperature sensor 263. Based on temperature information detected by the temperature sensor 263, the temperature control unit 238 controls power to the heater 206 so that desired temperature distribution can be obtained in the process chamber 201 at a desired time.

[Boat (Holder)]

The process chamber 201 is configured such that a boat 217, used as a holder for supporting substrates, can be loaded into the process chamber 201 from the opened bottom side of the manifold 209. The boat 217 is configured to support a plurality of substrates such as wafers 200 in horizontal orientations in multiple stages with centers of the wafers 200 being aligned with each other. For example, the boat 217 is made of a heat resistant material such as quartz ($SiO_2$) or silicon carbide (SiC). At the lower part of the boat 217, a plurality of disk-shaped insulating plates 216 are arranged as insulating members in horizontal orientations in multiple stages in the same manner as the wafers 200 are arranged. For example, the insulating plates 216 are made of a heat resistant material such as quartz (SiO2) or silicon carbide (SiC) in order to suppress heat transfer from the heater 206 to the manifold 209.

[Seal Cap and Shutter]

At the opened bottom side of the manifold 209, a seal cap 219 is installed detachably as a first furnace throat cover part, and a shutter 260 is installed detachably as a second furnace throat cover part, for air-tightly closing the reaction vessel 210. The seal cap 219 is configured to make contact with the bottom side of the manifold 209 from the lower side of the reaction vessel 210 in a vertical direction. For example, the seal cap 219 is made of a metal such as stainless steel and has a disk shape. On the top surface of the seal cap 219, an O-ring 220b is disposed as a seal member for making contact with the bottom side of the manifold 209.

At the bottom side of the seal cap 219 (that is, a side opposite to the process chamber 201), a rotary mechanism 254 is installed to rotate the boat 217. A rotation shaft 255 of the rotary mechanism 254 is inserted through the seal cap 219. The upper end of the rotation shaft 255 is connected to the boat 217 to support the bottom side of the boat 217. Therefore, as the rotary mechanism 254 operates, the boat 217 is rotated by the rotation shaft 255, and thus the wafers 200 can be rotated inside the process chamber 201.

The seal cap 219 is configured to be vertically lifted and lowered together with the boat 217 by a boat elevator 115, which is vertically installed outside the process tube 203 as an elevating mechanism. Therefore, by operating the boat elevator 115, the boat 217 can be loaded into the process chamber 201 and unloaded from the process chamber 201.

The shutter 260 is configured to seal the process chamber 201 after the boat 217 is unloaded from the process chamber 201. That is, the shutter 260 can be lifted, lowered, and rotated by a shutter driving device 261 installed at the heater base 251, so that after the boat 217 is unloaded from the process chamber 201, the shutter 260 can be brought into contact with the bottom side of the manifold 209 through lifting, lowering, and rotating motions powered by the shutter driving device 261. For example, the shutter 260 is made of a metal such as stainless steel and has a disk shape. On the top surface of the shutter 260, an O-ring 220c is disposed as a seal member for making contact with the bottom side of the manifold 209. FIG. 2 illustrates a state where the reaction vessel 210 is sealed by the shutter 260 after the boat 217 is unloaded from the reaction vessel 210.

A driving control unit 237 is electrically connected to the rotary mechanism 254, the boat elevator 115, and the shutter driving device 261. The driving control unit 237 controls the rotary mechanism 254, the boat elevator 115, and the shutter driving device 261 so that desired operations can be performed at desired times.

[Gas Supply Line]

At a side of the manifold 209, a gas supply line 230 is installed as a gas supply system for supplying process gas or inert gas to the inside of the reaction vessel 210 closed by the seal cap 219 or the shutter 260.

Hereinafter, the configuration of the gas supply line 230 will be described with reference to the attached drawings. FIG. 3 is a schematic view illustrating gas supply lines as a gas supply system of a vertical CVD apparatus relevant to an embodiment of the present invention.

As shown in FIG. 3, the gas supply line 230 includes a BTBAS (bis(tertiary-butylamino)silane, $SiH_2[NH(C_4H_9)]_2$) supply line 230a configured to supply vaporized BTBAS as process gas, and an $NH_3$ gas supply line 230b configured to supply $NH_3$ gas as process gas. At the leading ends of the BTBAS supply line 230a and the $NH_3$ gas supply line 230b, nozzles 270a and 270b are installed as shown in FIG. 1. The nozzles 270a and 270b are inserted through a side part of the manifold 209 and are configured to supply process gas to the inside of the process chamber 201.

An $N_2$ gas supply line 230c is connected to the BTBAS supply line 230a and the $NH_3$ gas supply line 230b so as to supply $N_2$ gas as inert gas. The $N_2$ gas supply line 230c is configured to supply $N_2$ gas to the inside of the process chamber 201 through the BTBAS supply line 230a and the $N_3$ gas supply line 230b. Like process gas, $N_2$ gas is supplied to the inside of the process chamber 201 through the nozzles 270a and 270b.

Hereinafter, detailed structures of the BTBAS supply line 230a, the $NH_3$ gas supply line 230b, and the $N_2$ gas supply line 230c will be described.

[BTBAS Supply Line]

A BTBAS supply source 50 configured to supply liquid BTBAS which is liquid at room temperature; a liquid mass flow controller (LMFC) 51 used as a liquid flow rate controller for controlling the flow rate of liquid BTBAS; and a vaporizer 52 configured to vaporize BTBAS for generating raw material gas as process gas are connected in series to the BTBAS supply line 230a.

The BTBAS supply source 50 includes an airtight raw material tank 50a configured to store BTBAS as a liquid raw material. An extrusion gas supply line 50b is inserted through a ceiling part of the raw material tank 50a for supplying $N_2$ or He gas to the inside of the raw material tank 50a as extrusion gas, and the BTBAS supply line 230a is inserted through the ceiling part of the raw material tank 50a for supplying BTBAS extruded from the raw material tank 50a to the LMFC 51. A downstream-side end part 50d of the extrusion gas supply line 50b has an opening at an upper part of the raw material tank 50a (that is, at a position higher than the level of liquid BTBAS), and an upstream-side end part 50e of the BTBAS supply line 230a has an opening at a lower part of the raw material tank 50a (that is, at a position lower than the level of liquid BTBAS). At the extrusion gas supply line 50b, an on-off valve 50c is installed for controlling supply of extrusion gas.

Therefore, when extrusion gas is supplied to the inside of the raw material tank 50a by opening the on-off valve 50c, BTBAS is extruded from the raw material tank 50a to the LMFC 51 through the BTBAS supply line 230a. While controlling the flow rate of the extruded BTBAS using the LMFC 51, the extruded BTBAS is supplied to the vaporizer 52. The vaporizer 52 vaporizes the BTBAS by heating the BTBAS to generate the vaporized BTBAS (hereinafter, referred to as BTBAS gas) as process gas.

The downstream side of the vaporizer 52 is connected to the inside of the process chamber 201 through the BTBAS supply line 230a. An on-off valve 53 is installed between the vaporizer 52 of the BTBAS supply line 230a and the manifold 209. In addition, a part of the BTBAS supply line 230a located at the upstream side of the on-off valve 53 (that is, between the vaporizer 52 and the on-off valve 53) is connected to the downstream side of a main exhaust valve 231b of a main exhaust line 231a (described later) through an on-off valve 54.

Therefore, BTBAS gas generated at the vaporizer 52 can be supplied to the process chamber 201 by opening the on-off valve 53 and closing the on-off valve 54. In addition, BTBAS gas can be exhausted to the outside of the process chamber 201 through the main exhaust line 231 a without supplying the BTBAS gas to the inside of the process chamber 201 by closing the on-off valve 53 and opening the on-off valve 54. Since it takes time to generate BTBAS gas stably using the vaporizer 52, the on-off valve 53 is closed and the on-off valve 54 is opened until BTBAS gas is stably generated at the vaporizer 52, and then the on-off valve 54 is closed and the on-off valve 53 is opened after BTBAS is stably generated at the vaporizer 52. By switching the on-off valves 53 and 54 in this way, process gas can be supplied to the inside of the process chamber 201 stably and rapidly.

[$NH_3$ Gas Supply Line]

An $NH_3$ gas supply source 60 configured to supply $NH_3$ gas as process gas, and a mass flow controller (MFC) 61 used as a flow rate controller for controlling the flow rate of $NH_3$ gas are connected in series to the $NH_3$ gas supply line 230b. An on-off valve 62 is installed at the $NH_3$ gas supply line 230b between the $NH_3$ gas supply source 60 and the MFC 61, and an on-off valve 63 is installed at the $NH_3$ gas supply line 230b between the MFC 61 and the manifold 209.

Therefore, $NH_3$ gas can be supplied to the inside of the process chamber 201 while controlling the flow rate of the $NH_3$ gas using the MFC 61 after opening the on-off valves 62 and 63.

[$N_2$ Gas Supply Line]

An $N_2$ gas supply source 70 configured to supply $N_2$ gas as inert gas, and a mass flow controller (MFC) 71 used as a flow rate controller for controlling the flow rate of $N_2$ gas are connected in series to the $N_2$ gas supply line 230c. An on-off valve 72 is installed at the $N_2$ gas supply line 230c between the $N_2$ gas supply source 70 and the MFC 71. The downstream side of the MFC 71 of the $N_2$ gas supply line 230c is connected to the downstream side of the on-off valve 53 of the BTBAS supply line 230a (that is, a side between the on-off valve 53 and the manifold 209) through an on-off valve 73a. In addition, the downstream side of the MFC 71 of the $N_2$ gas supply line 230c is connected to the downstream side of the on-off valve 63 of the $NH_3$ gas supply line 230b (that is, a side between the on-off valve 63 and the manifold 209) through an on-off valve 73b.

Therefore, in a state where supply of process gas (BTBAS gas and $NH_3$ gas) to the inside of the process chamber 201 is stopped by closing the on-off valves 53 and 63, $N_2$ gas can be supplied to the inside of the process chamber 201 through the BTBAS supply line 230a by opening the on-off valve 73a. In addition, $N_2$ gas can be supplied to the inside of the process chamber 201 through the $NH_3$ gas supply line 230b by opening the on-off valve 73b. In addition, $N_2$ gas can be supplied to the inside of the process chamber 201 through both the BTBAS supply line 230a and the $NH_3$ gas supply line 230b by opening both the on-off valves 73a and 73b. Alternatively, $N_2$ gas can be directly supplied to the inside of the process chamber 201 by connecting a part of the $N_2$ gas supply line 230c located at the downstream side of the MFC 71 directly to a side part of the manifold 209.

A gas supply/flowrate control unit 235 is electrically connected to components of the gas supply line 230 such as the on-off valves 50c, 53, 54, 62, 63, 72, 73a, and 73b, the LMFCs 51, 61, and 71, and the vaporizer 52. The gas supply/flowrate control unit 235 controls the components of the gas supply line 230 so that desired operations of the components can be performed at desired times.

[Main Exhaust Line]

At a side of the manifold 209 opposite to the gas supply line 230, the main exhaust line 231a is installed. The main exhaust line 231a constitutes a gas exhaust line 231 used as a gas exhaust system for exhausting the inside of the process chamber 201. The main exhaust line 231a communicates with a lower end part of a cylindrical space (clearance) 250 between the inner tube 204 and the outer tube 205.

Figure 4A:
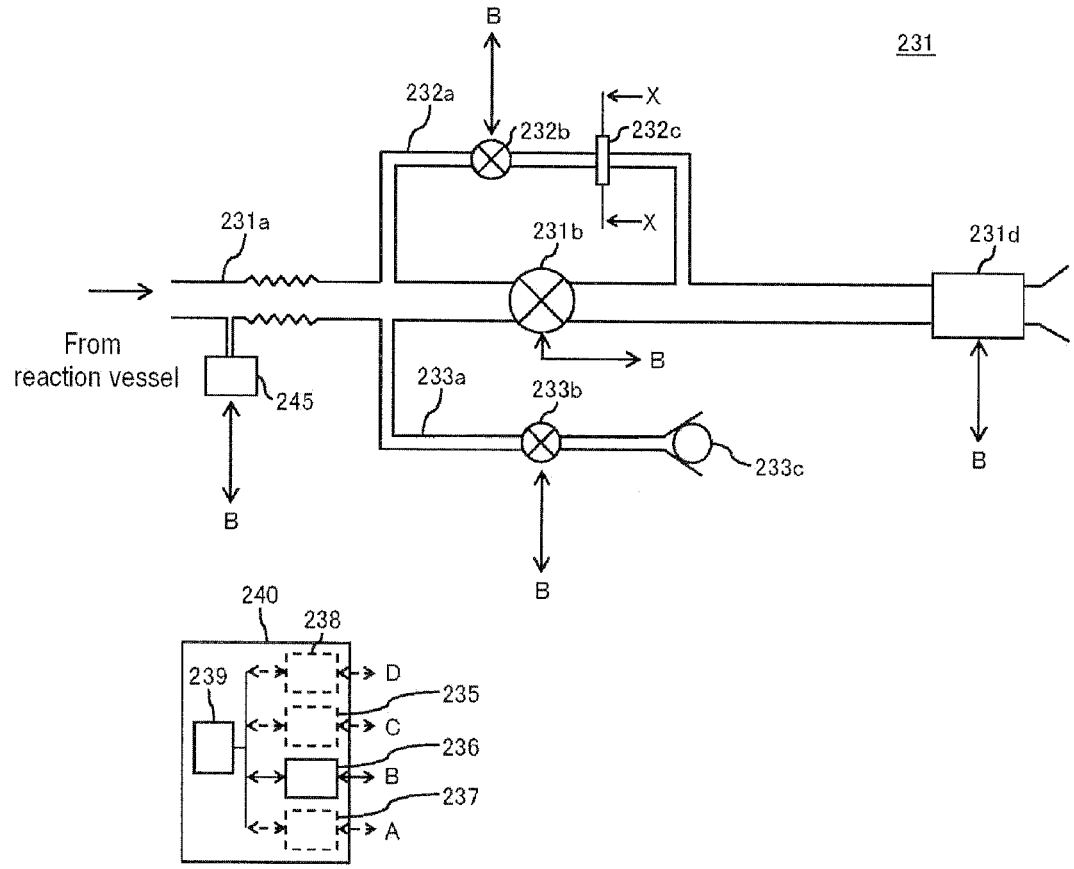
FIG. 4A is a schematic view illustrating gas exhaust lines including a main exhaust line and a slow exhaust line, as a gas exhaust system of a vertical CVD apparatus which is a substrate processing apparatus relevant to an embodiment of the present invention.

As shown in FIG. 4A, a main exhaust valve 231b composed of a pressure regulator such as an auto pressure controller (APC) valve, and a vacuum exhaust device 231d such as a vacuum pump are connected in series to the downstream side of the main exhaust line 231a (a side of the main exhaust line 2311a opposite to the manifold 209). Therefore, the inside of the process chamber 201 can be exhausted by opening the main exhaust valve 231b and operating the vacuum exhaust device 231d.

At a part of the main exhaust line 231a located at the upstream side of the main exhaust valve 231b, a pressure sensor 245 used as a pressure detector, and an overpressure preventing line 233a are installed. A check valve 233c is installed at the overpressure preventing line 233a with an on-off valve 233b being disposed therebetween. The overpressure preventing line 233a branches off from the main exhaust line 231a, and the inner diameter of the overpressure preventing line 233a is smaller than the inner diameter of the main exhaust line 231a.

An exhaust/pressure control unit 236 is electrically connected to the main exhaust valve 231b, the vacuum exhaust device 231d, the pressure sensor 245, and the on-off valve 233b. The exhaust/pressure control unit 236 controls the main exhaust valve 231b to open or close the main exhaust valve 231b at a desired time. Furthermore, the exhaust/pressure control unit 236 adjusts the opened area of the main exhaust valve 231b based on pressure information detected (measured) by the pressure sensor 245 so as to adjust the inside pressure of the process chamber 201 to a desired level (vacuum degree) at a desired time. In addition, in case the inside pressure of the process chamber 201 exceeds atmospheric pressure, for example, when the inside pressure of the process chamber 201 is returned to atmospheric pressure, the exhaust/pressure control unit 236 controls the operation of the on-off valve 233b to exhaust excessive gas from the inside of the process chamber 201 through the check valve 233c.

[Slow Exhaust Line]

At the main exhaust line 231a, a slow exhaust line 232a is installed. The slow exhaust line 232a constitutes the gas exhaust line 231 used as a gas exhaust system for exhausting the inside of the process chamber 201 and branches off from the main exhaust line 231a. The slow exhaust line 232a is installed in parallel with the main exhaust line 231a, and the inner diameter of the slow exhaust line 232a is smaller than the inner diameter of the main exhaust line 231a. The slow exhaust line 232a is connected to the main exhaust line 231a so as to bypass the main exhaust valve 231b. That is, the slow exhaust line 232a is connected to the main exhaust line 231a at the upstream and downstream sides of the main exhaust valve 231b.

At the slow exhaust line 232a, a slow exhaust valve 232b is installed. The exhaust/pressure control unit 236 is electrically connected to the slow exhaust valve 232b. The exhaust/pressure control unit 236 controls opening and closing operations of the slow exhaust valve 232b at desired times. Therefore, by controlling components of the gas exhaust system using the exhaust/pressure control unit 236 in a way of opening the slow exhaust valve 232b and operating the vacuum exhaust device 231d, the inside of the process chamber 201 can be exhausted through the slow exhaust line 232a even when the main exhaust valve 231b is closed. In this case, gas exhausted from the inside of the process chamber 201 through the slow exhaust line 232a is discharged to a part of the main exhaust line 231a located at the downstream side of the main exhaust valve 231b.

Figure 4B:
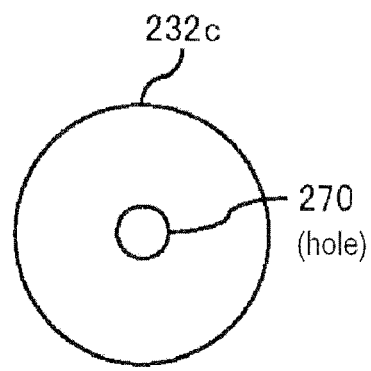
FIG. 4B is sectional view of an orifice 232c taken from line X-X of FIG. 4A.

At the slow exhaust line 232a, an orifice 232c is installed as a conductance adjusting unit for adjusting the conductance inside the slow exhaust line 232a. As shown in FIG. 4B, the orifice 232c is configured as a partition plate (i.e., throttle part) having a circular hole 270 at a center part. The diameter of the circular hole 270 is smaller than the inner diameter of the slow exhaust line 232a. Owing to the orifice 232c, when gas is exhausted through the slow exhaust line 232a, the upstream side of the orifice 232c (a side facing the process chamber 201) can be kept at atmospheric pressure, and the downstream side of the orifice 232c (the downstream side of the main exhaust valve 231b of the main exhaust line 231a) can be depressurized, thereby preventing backflow of contaminants from the inside of the main exhaust line 231a to the inside of the process chamber 201 and adhesion of reaction byproducts to the inside of the main exhaust line 231a. In addition, owing to the orifice 232c, when gas is exhausted through the slow exhaust line 232a, the gas exhaust rate can be stably maintained, and load on the vacuum exhaust device 231d can be reduced. The orifice 232c can be installed at an upstream or downstream position with respect to the slow exhaust valve 232b.

[Controller]

The gas supply/flowrate control unit 235, the exhaust/pressure control unit 236, the driving control unit 237, and the temperature control unit 238 are electrically connected to a main control unit 239 that controls the overall operation of the substrate processing apparatus. A controller 240 of the substrate processing apparatus is constituted by the gas supply/flowrate control unit 235, the exhaust/pressure control unit 236, the driving control unit 237, the temperature control unit 238, and the main control unit 239.

(2) Substrate Processing Method

Figure 5:
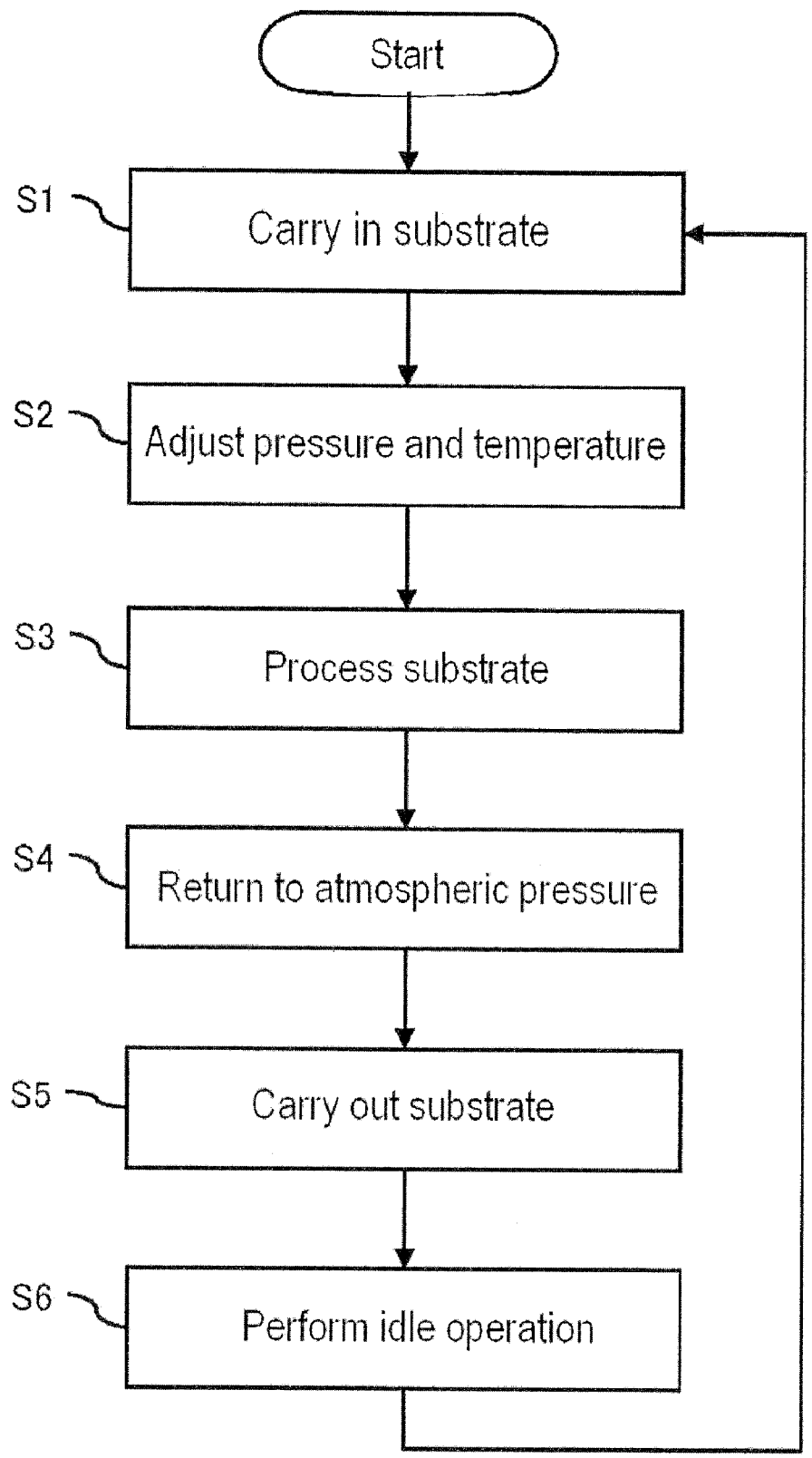
FIG. 5 is a flowchart for explaining a substrate processing method which is executed as one process of processes of manufacturing a semiconductor device and relevant to an embodiment of the present invention.

Next, as an example of a substrate processing method relevant to an embodiment of the present invention, a method of forming a thin film on a wafer 200 by a CVD method using the above-described substrate processing apparatus, as one process of processes of manufacturing a semiconductor device, will be explained with reference to FIG. 5. In the following description, each part of the substrate processing apparatus is controlled by the controller 240.

[Substrate Carrying-In Operation S1]

As shown in FIG. 2, after lowering the seal cap 219 and the boat 217 by using the boat elevator 115 and sealing the reaction vessel 210 by using the shutter 260, a plurality of wafers 200 are charged into the boat 217 (wafer charging). Thereafter, the shutter 260 is lowered and swung by using the shutter driving device 261 so as to open the bottom side of the manifold 209. Then, as shown in FIG. 1, the boat 217 in which the wafers are held is lifted using the boat elevator 115 to load the boat 217 into the process chamber 201 (boat loading). After that, the opened bottom side of the manifold 209 is sealed by the seal cap 219 with the O-ring 220b being disposed between the manifold 209 and the seal cap 219. The resultant state is shown in FIG. 1.

[Pressure and Temperature Adjustment Operations S2]

Next, the inside pressure of the process chamber 201 is adjusted to a desired pressure level (vacuum degree) as follows: the inside of the process chamber 201 is gradually exhausted (slow exhausting) through the slow exhaust line 232a by operating the vacuum exhaust device 231d, closing the main exhaust valve 231b, and opening the slow exhaust valve 232b; and then the inside of the process chamber 201 is evacuated (main exhausting) through the main exhaust line 231a by closing the slow exhaust valve 232b and opening the main exhaust valve 231b. At this time, the pressure inside the process chamber 201 is detected (measured) using the pressure sensor 245, and the main exhaust valve 231b is feedback-controlled based on the detected pressure information.

In addition, the inside of the process chamber 201 is heated using the heater 206 so as to increase the surface temperature of the wafers 200 to a desired temperature. At this time, to obtain desired temperature distribution in the process chamber 201, power to the heater 206 is feedback-controlled based on temperature information detected by the temperature sensor 263.

After or at the same time with the pressure and temperature adjustment operations S2, the rotary mechanism 254 is operated to rotate the wafers together with the boat 217.

[Substrate Processing Operation S3]

Next, extrusion gas is supplied to the raw material tank 50a by opening the on-off valve 50c to extrude BTBAS from the raw material tank 50a to the LMFC 51, and while controlling the flow rate of the extruded BTBAS using the LMFC 51, the BTBAS is supplied to the vaporizer 52 where the BTBAS is heated and vaporized into gas. Preferably, the BTBAS gas is generated before the pressure and temperature adjustment operations S2 are completed. At this time, preferably, the on-off valve 53 is closed, and the on-off valve 54 is opened, in order to exhaust the generated BTBAS gas through the main exhaust line 231a without supplying the generated BTBAS gas to the inside of the process chamber 201.

Next, the on-off valves 62 and 63 are opened, and while controlling the flow rate of $NH_3$ gas using the MFC 61, the $NH_3$ gas is supplied into the pressure-adjusted process chamber 201. The supplied $NH_3$ gas moves upward in the process chamber 201 and is discharged through the opened top side of the inner tube 204 to the cylindrical space 250 where the $NH_3$ gas is exhausted through the main exhaust line 231a. At this time, the on-off valves 72, 73a, and 73b can be opened to supply $N_2$ gas to the inside of the process chamber 201 together with the $NH_3$ gas.

Next, while continuing supply of NH₃ gas, the on-off valve 54 is closed, and the 53 is opened to supply BTBAS gas into the pressure-adjusted process chamber 201. The BTBAS gas is mixed with NH₃ gas supplied in advance, and the mixture moves upward in the process chamber 201 and is discharged through the opened top side of the inner tube 204 to the cylindrical space 250 where the mixture is exhausted through the main exhaust line 231a. At this time, the on-off valves 72, 73a, and 73b can be opened to supply N₂ gas to the inside of the process chamber 201 together with the BTBAS gas.

When the mixture gas of NH₃ and BTBAS passes through the process chamber 201, the mixture gas makes contact with surfaces of the wafers 200. Thus, silicon nitride thin films are deposited on the surfaces of the wafers 200 by thermal CVD reaction.

After a predetermined process time passes and the silicon nitride thin films are formed on the surfaces of the wafers 200 to a desired thickness, first, the on-off valve 54 is opened and the on-off valve 53 is closed to stop supply of BTBAS gas to the inside of the process chamber 201. Secondly, the on-off valves 62 and 63 are closed to stop supply of NH₃ gas to the inside of the process chamber 201.

During the substrate processing operation S3, while the inside of the process chamber 201 is continuously evacuated using the vacuum exhaust device 231d, the inside of the process chamber 201 is kept at a predetermined pressure (process pressure) by using the main exhaust valve 231b.

[Atmospheric Pressure Return Operation S4]

Next, the on-off valves 72, 73a, and 73b are opened to supply N₂ gas to the inside of the process chamber 201 for purging the inside of the process chamber 201. Thus, the inside atmosphere of the process chamber 201 is replaced with N₂ gas, and the inside pressure of the process chamber 201 returns to atmospheric pressure.

[Substrate Carrying-out Operation S5]

Next, by the boat elevator 115, the seal cap 219 is moved downward to open the bottom side of the manifold 209, and at the same time, the boat 217 in which the processed wafers 200 are held is moved downward to unload the boat 217 from the process chamber 201 (boat unloading). At this time, it is preferable that N₂ gas be allowed to flow consistently through the reaction vessel 210 in a state where the on-off valves 72, 73a, and 73b are opened. Thereafter, the shutter 260 is swung and lifted by the shutter driving device 261 so as to seal the opened bottom side of the manifold 209 using the shutter 260 with the O-ring 220c being disposed between the shutter 260 and the manifold 209. The resultant state is shown in FIG. 2. Then, the processed wafers 200 are discharged from the boat 217 which is unloaded from the process chamber 201 (wafer discharging).

[Idle Operation S6]

While the boat 217 rests at an unloaded position (home position lower than the opened bottom side of the manifold 209), the opened bottom side of the manifold 209 is sealed by the shutter 260 as described above. During this idle operation S6 where the apparatus is idle, the reaction vessel 210 is kept at the state shown in FIG. 2.

During the idle operation S6, the MFC 71 is operated in a state where the on-off valves 72, 73a, and 73b are opened to supply N₂ gas into the process chamber 201 at a flow rate higher than the total flow rate of process gas supplied into the process chamber 201 during the substrate processing operation S3.

The total flow rate of process gas means the sum of flow rates of various gases supplied into the process chamber 201 in substrate processing operation S3. That is, the total flow rate is the sum of flow rates of NH₃ gas and BTBAS gas. If N₂ gas is also supplied during the substrate processing operation S3, the flow rate of N₂ gas is added to the total flow rate.

During the idle operation S6, N₂ gas is supplied to the inside of the process chamber 201 at the above-described flow rate, and at the same time, the main exhaust valve 231b is closed and the slow exhaust valve 232b is opened so as to exhaust the inside of the process chamber 201 through the slow exhaust line 232a. N₂ gas exhausted from the inside of the process chamber 201 through the slow exhaust line 232a is allowed to bypass the main exhaust valve 231b and flow to a part of the main exhaust line 231a located at the downstream side of the main exhaust valve 231b. At this time, while N₂ gas is exhausted through the slow exhaust line 232a, the N₂ gas passes through the orifice 232c installed at the slow exhaust line 232a, so that the upstream side of the orifice 232c (a side facing the process chamber 201) can be kept at atmospheric pressure, and the downstream side of the orifice 232c (the downstream side of the main exhaust valve 231b of the main exhaust line 231a) can be depressurized. This purge wilt be also referred to as an idle purge.

The above-described state (i.e., idle purge) is kept until the next substrate carrying-in operation S1 is performed. That is, until the shutter 260 is lowered and swung by the shutter driving device 261 to open the bottom side of the manifold 209 again in order to load the boat 217 into the process chamber 201 again, exhausting through the slow exhaust line 232a is continued in a state where N₂ gas is being supplied to the inside of the process chamber 201 at a high flow rate.

(3) Effects by Embodiment of Present Invention

According to the embodiment of the present invention, one or more of the following effects can be attained.

According to the embodiment of the present invention, in idle operation S6, while N₂ gas is supplied to the inside of the process chamber 201, the main exhaust valve 231b is closed and the slow exhaust valve 232b is opened, so as to exhaust the inside of the process chamber 201 through the slow exhaust line 232a. That is, in idle operation S6, the main exhaust valve 231b is closed. Therefore, byproducts and components of the byproducts can be prevented from flowing back from a part of the main exhaust line 231a located at the downstream side of the main exhaust valve 231b to the inside of the process chamber 201, and at the same time, contaminants having a small particle diameter can be prevented from being generated on the surfaces of wafers 200.

In addition, according to the embodiment of the present invention, during the idle operation S6, in a state where the inside of the process chamber 201 is consistently kept at atmospheric pressure, the inside of the process chamber 201 is exhausted through the slow exhaust line 232a while supplying N₂ gas into the process chamber 201 at a flow rate greater than the total flow rate of process gas supplied during the substrate processing operation S3. Therefore, a large gas flow with high flow rate can be formed inside the process chamber 201 in a direction from a gas supply side to a gas exhaust side, and owing to this large gas flow, backflow of byproducts from the exhaust line to the inside of the process chamber 201 can be prevented. At this time, if the inside of the process chamber 201 is exhausted in a depressurized condition (vacuum condition), the velocity of a gas flow can be increased; in this case, however, the distance between N₂ molecules increases, and thus the N₂ molecules exist sparsely in the gas flow, so that it is difficult to effectively discharge contaminants such as byproducts tending to flow back because the probability of collision between the N₂ molecules and the byproducts becomes low. However, if the inside of the process chamber 201 is exhausted in an atmospheric pressure condition, although the velocity of a gas flow decreases, the distance between $N_2$ molecules can be decreased, and thus the $N_2$ molecules can exist densely in the gas flow, so that contaminants such as byproducts tending to flow back can be effectively discharged because the probability of collision between the $N_2$ molecules and the byproducts becomes high.

In addition, if the inside of the process chamber 201 is exhausted in a vacuum condition, eventually, it is necessary to return the inside pressure of the process chamber 201 from vacuum to atmospheric pressure, and thus a considerable time is necessary for the pressure returning. Moreover, during transition from vacuum to atmospheric pressure, byproducts can easily flow back from the exhaust line into the process chamber 201. However, if the inside of the process chamber 201 is exhausted in an atmospheric pressure condition, it is not necessary to return the inside pressure of the process chamber 201 from vacuum to atmospheric pressure. Thus, time loss can be prevented, and byproducts cannot easily flow back from the exhaust line into the process chamber 201.

In addition, according to the embodiment of the present invention, owing to the orifice 232c inserted in the slow exhaust line 232a for adjusting the conductance of the slow exhaust line 232a, when the inside of the process chamber 201 is exhausted through the slow exhaust line 232a while $N_2$ gas is being supplied to the inside of the process chamber 201 at a high flow rate, a gas flow path located at the upstream side of the orifice 232c can be kept at atmospheric pressure, and a gas flow path located at the downstream side of the orifice 232c can be depressurized. That is, the gas flow path located at the upstream side of the orifice 232c can be purged in an atmospheric pressure condition, and the gas flow path located at the downstream side of the orifice 232c can be purged in a depressurized condition. Here, the gas flow path located at the upstream side of the orifice 232c includes a part of the slow exhaust line 232a located at the upstream side of the orifice 232c, a part of the main exhaust line 231a located at the upstream side of the main exhaust valve 231b, and the process chamber 201. In addition, the gas flow path located at the downstream side of the orifice 232c includes a part of the slow exhaust line 232a located at the downstream side of the orifice 232c and a part of the main exhaust line 231a located at the downstream side of the main exhaust valve 231b.

When the inside of the process chamber 201 is exhausted through the slow exhaust line 232a while supplying $N_2$ gas to the inside of the process chamber 201 at a high flow rate, the gas flow path located at the upstream side of the orifice 232c is kept at atmospheric pressure, so that an atmospheric-pressure gas flow can be consistently formed in the gas flow path located at the upstream side of the orifice 232c, and thus contaminants such as byproducts tending to flow back from the exhaust line into the process chamber 201 can be effectively discharged as described above.

In addition, when the inside of the process chamber 201 is exhausted through the slow exhaust line 232a while supplying $N_2$ gas to the inside of the process chamber 201 at a high flow rate, the gas flow path located at the downstream side of the orifice 232c is depressurized, so that an depressurized gas flow can be consistently formed in the gas flow path located at the downstream side of the orifice 232c. Therefore, byproducts such as $NH_4Cl$ can be prevented from adhering to the inside of the gas flow path located at the downstream side of the orifice 232c, and thus clogging caused by adhesion of byproducts can be prevented.

At this time, if the gas flow path located at the downstream side of the orifice 232c is kept at atmospheric pressure, when gas such as $NH_4Cl$ flows from the process chamber 201 having large capacity into piping, being the gas flow path, having small-capacity and low-temperature (e.g., less than 120° C.), the gas can easily adhere to the inside of the piping, and thus the piping can be easily clogged. Moreover, in the case where the inside of the piping is exhausted at atmospheric pressure, since similar pressure conditions are continued in the last, byproducts such as $NH_4Cl$ adhered to the inside of the piping may flow back by the Brownian motion.

However, if the gas flow path located at the downstream side of the orifice 232c is depressurized, gas such as $NH_4Cl$ flown from the inside of the process chamber 201 into the piping can be discharged in a gas state, and thus substances such as $NH_4Cl$ can be prevented from adhering to the inside of the piping, and clogging of the piping can be prevented. Furthermore, substances such as $NH_4Cl$ can be prevented from flowing back from the inside of the piping to the inside of the process chamber 201.

In addition, according to the embodiment of the present invention, since the orifice 232c is inserted in the slow exhaust line 232a for adjusting the conductance of the slow exhaust line 232a, the gas exhaust rate through the slow exhaust line 232a can be stably maintained, and at the same time, load on the vacuum exhaust device 231d can be reduced.

In addition, according to the embodiment of the present invention, during the idle operation S6, $N_2$ gas exhausted from the inside of the process chamber 201 through the slow exhaust line 232a is discharged to a part of the main exhaust line 231a located at the downstream side of the main exhaust valve 231b. That is, during the idle operation S6, an $N_2$ gas flow is consistently formed in the main exhaust line 231a so that the inside of the main exhaust line 231a can be consistently kept at a clean state. Therefore, backflow of byproducts and components of the byproducts from the inside of the main exhaust line 231a to the inside of the process chamber 201 can be prevented more reliably.

EXAMPLES

Example 1

Hereinafter, Example 1 of the present invention will be explained together with a comparative example.

In both Example 1 and the comparative example, $Si_3N_4$ films were formed on wafers using the substrate processing method explained according to the embodiment of the present invention. BTBAS gas and $NH_3$ gas were used as process gas, film forming temperature was in the range of 590° C. to 600° C., process pressure was in the range of 10 Pa to 100 Pa, BTBAS gas was supplied at a flow rate of 0.05 slm to 0.1 slm, and $NH_3$ gas was supplied at a flow rate of 0.1 slm to 1 slm. In Example 1, idle purge was performed after a film forming process, and in the comparative example, idle purge was not performed after a film forming process. When the idle purge was performed, $N_2$ gas was supplied at a flow rate of 15 slm to 20 slm. A diameter of a hole of an orifice 232c installed at the slow exhaust line 232a was set to 1 mm to 3 mm. First, a continuous batch treatment was performed four times in the comparative example, and then, a continuous batch treatment was performed six times in Example 1. After each batch treatment, the number of particles on a wafer was measured. The measured results are shown in FIG. 6.

Figure 6:
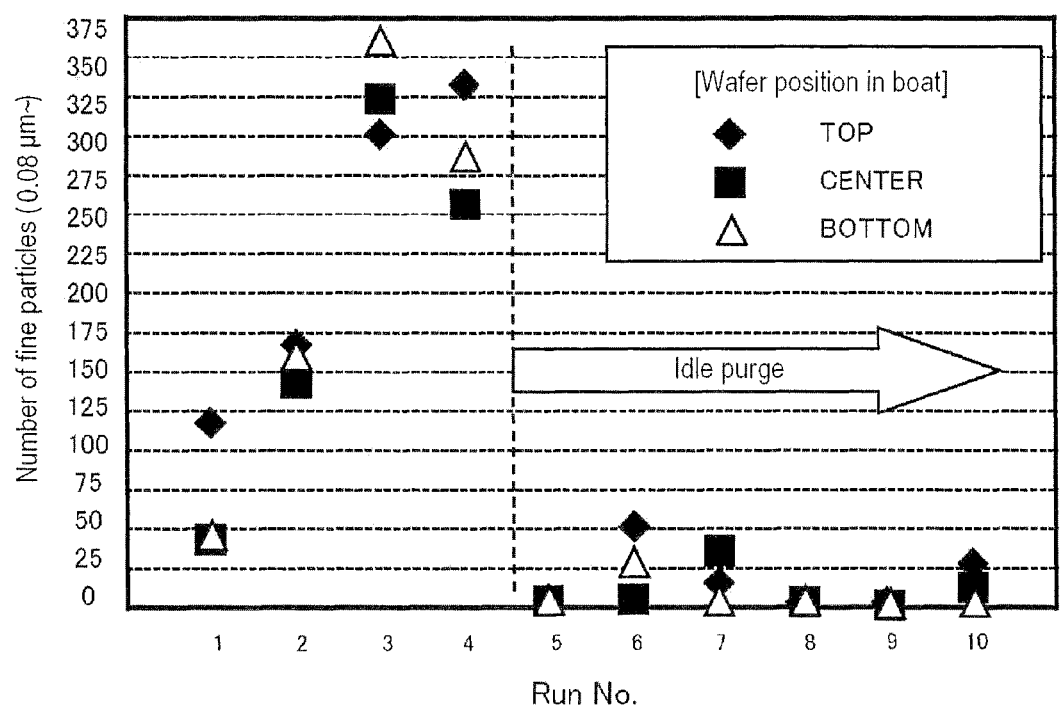
FIG. 6 is a graph illustrating the numbers of fine particles (contaminants) existing on processed wafers in an experimental example, in which symbols ♦, ■, and Δ are used to denote the numbers of fine particles (contaminants) existing on wafers 200 disposed at top, center, and bottom parts of the boat 217, respectively.

FIG. 6 is a graph showing the numbers of fine particles (contaminants) existing on the processed wafers in Example 1 and the comparative example. The horizontal axis of FIG. 6 denotes the number (Run No.) of batch treatments: Nos. 1 to 4 represent continuous batch treatments in the comparative example, and Nos. 5 to 10 represent continuous batch treatments in Example 1. The vertical axis of FIG. 6 denotes the numbers of fine particles (0.08 μm or larger) existing on the processed wafers. Symbols ♦, ■, and ∆ denote the numbers of fine particles (contaminants) existing on wafers 200 disposed at top, center, and bottom parts of the boat 217, respectively.

As shown in FIG. 6, in the comparative example (Nos. 1 to 4), although the number of fine particles (contaminants) was small at the first batch treatment (No. 1), the number of fine particles (contaminants) increased as the batch treatments were sequentially performed (Nos. 2 to 4).

However, in the case of Example 1 (Nos. 5 to 10) where idle purge was performed, the number of fine particles (contaminants) decreased greatly as compared with the comparative example (Nos. 1 to 4).

Example 2

Hereinafter, Example 2 of the present invention will be explained.

In Example 2, $Si_3N_4$ films were formed on wafers using the substrate processing method explained according to the embodiment of the present invention. DCS (dichlorosilane) gas and $NH_3$ gas were used as process gas, film forming temperature was in the range of 650° C. to 800° C., process pressure was in the range of 10 Pa to 500 Pa, DCS gas was supplied at a flow rate of 0.2 slm, and $NH_3$ gas was supplied at a flow rate of 0.6 slm. After filming forming processes, idle purge processes were performed while varying the flow rate of $N_2$ gas supply. In addition, idle purge processes were performed while varying the size (diameter) of the hole 270 of the orifice 232c installed at the slow exhaust line 232a. After the film forming processes, back diffusion of byproducts, and floating of particles were checked. The checked results are shown in FIG. 11. In FIG. 11, O denotes the case where back diffusion of byproducts did not occur and the case where floating of particles did not occur, and X denotes the case where back diffusion of byproducts occurred and the case where floating of particles occurred.

Referring to FIG. 11, in the case where the inside of the process chamber 201 is exhausted using tie vacuum exhaust device 231d through the slow exhaust line 232a at which the orifice 232c is installed while supplying $N_2$ gas to the inside of the process chamber 201 during an idle operation, back diffusion of byproducts such as $NH_4Cl$ adhered to an exhaust part cannot be sufficiently prevented if the flow rate of the $N_2$ gas is lower than 5 slm and the orifice diameter (i.e., the diameter of the hole 270 of the orifice 232c) is in the range from 1 mm to 3 mm. If the flow rate of the $N_2$ gas increases higher than 30 slm while keeping the orifice diameter in the range from 1 mm to 3 mm, particles are floated from an inner bottom part of the process chamber 201. Therefore, when the orifice diameter is in the range from 1 mm to 3 mm, it is preferable that the flow rate of $N_2$ gas be in the range from 5 slm to 30 slm.

In the case where the orifice diameter is smaller than 1 mm, although the flow rate of the $N_2$ gas is 5 slm or higher, back diffusion of byproducts such as $NH_4Cl$ adhered to an exhaust part cannot be sufficiently prevented. In the case where the orifice diameter is greater than 3 mm, the flow rate of the $N_2$ gas should be 100 slm or higher to sufficiently prevent back diffusion of byproducts such as $NH_4Cl$ adhered to an exhaust part; in this case, however, particles are floated from an inner lower part of the process chamber 201.

Therefore, so as to sufficiently prevent back diffusion of byproducts such as $NH_4Cl$ adhered to an exhaust part and floating of particles from an inner lower part of the process chamber 201, it is required to maintain the orifice diameter in the range from 1 mm to 3 mm and the flow rate of $N_2$ gas in the range from 5 slm to 30 slm.

Other Embodiments

In the above-described embodiments, BTBAS gas and $NH_3$ gas are used as process gas to form a $Si_3N_4$ film (BTBAS-SiN film). However, the present invention is not limited to the above-described embodiments. For example, the present invention can be applied to the case where chlorine-based silane gas such as DCS (dichlorosilane, $SiH_2Cl_2$) gas, TCS (trichlorosilane, $SiHCl_3$) gas, or HCD (hexachlorodisilane, $Si_2Cl_6$) gas is used instead of BTBAS gas for forming a $Si_3N_4$ film, or the case where hydrazine-based gas such as $N_2H_4$ gas is used instead of $NH_3$ gas for forming a $Si_3N_4$ film.

Figure 7A:
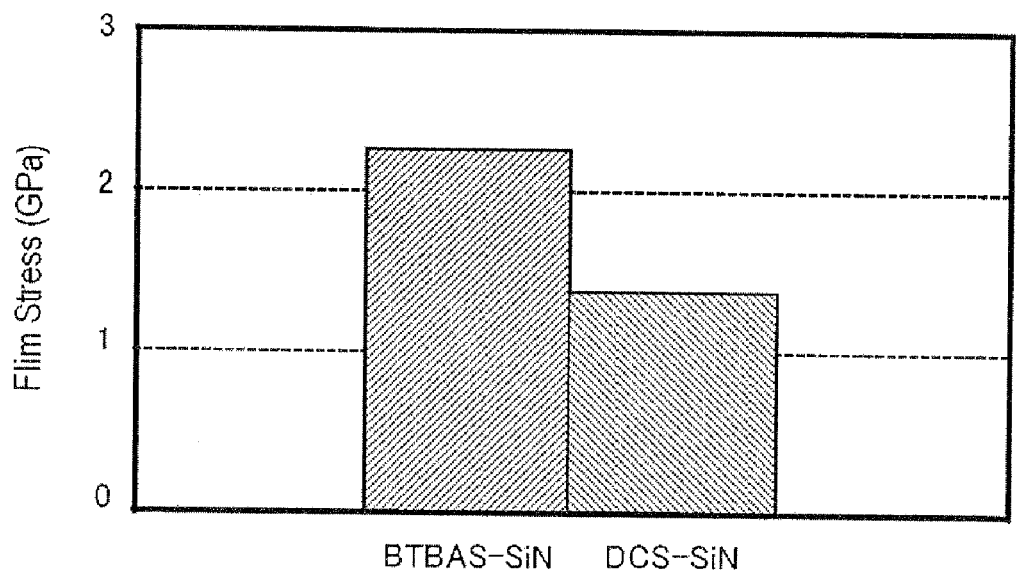
FIG. 7A and FIG. 7B are graphs for comparing film stresses and film shrinkages of BTBAS-SiN and DCS-SiN films, in which the vertical axis of FIG. 7A denotes stresses of the films and the vertical axis of FIG. 7B denotes shrinkages of the films.
Figure 7B:
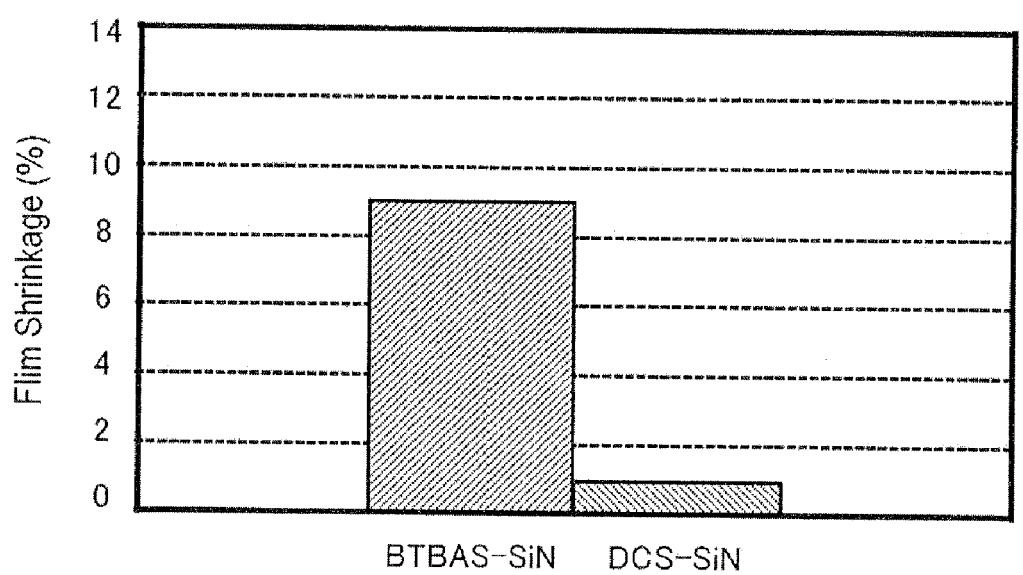

However, the properties of a BTBAS-SiN film such as film stress and film shrinkage are largely different from those of a film such as DCS-SiN film although the BTBAS-SiN film and the DCS-SiN film have the same chemical composition. FIG. 7A and FIG. 7B are graphs for comparing film stresses and film shrinkages of BTBAS-SiN and DCS-SiN films. The vertical axis of FIG. 7A denotes stresses of the films, and the vertical axis of FIG. 7B denotes shrinkages of the films.

As shown in FIG. 7A, the stress of the DCS-SiN film is about 1 GPa; however, the stress of the BTBAS-SiN film is at least 2 GPa. That is, the stress of the BTBAS-SiN film is about two times the stress of the DCS-SiN film. In addition, as shown in FIG. 7B, the shrinkage of the DCS-SiN film is about 1%; however, the shrinkage of the BTBAS-SiN film is about 9%. That is, the shrinkage of the BTBAS-SiN film is about nine times the shrinkage of the DCS-SiN film.

As explained above, the stress and shrinkage of the BTBAS-SiN film are much greater than those of the DCS-SIN film. Therefore, the BTBAS-SiN film and the DCS-SiN film are stripped in different ways. That is, when the thickness of the DCS-SiN film reaches about 10000 Å (1 µm) or more, the DCS-SiN film is stripped, and particles (contaminants) are generated. On the other hand, much before the thickness of the BTBAS-SiN film reaches 10000 Å (1 µm), specifically, when the thickness of the BTBAS-SiN film reaches about 4000 Å, the BTBAS-SiN film is stripped, and particles (contaminants) are generated. That is, the BTBAS-SiN film is stripped at a very thin thickness as compared with the DCS-SiN film (i.e., at a thickness level where the stripping of the DCS-SiN film does not occur). Therefore, the present invention may be particularly useful for the case of forming a very strippable film such as a BTBAS-SiN film.

Besides the BTBAS-SiN film, other films such as an SiON film (hereinafter, referred to as a BTBAS-SiON film) formed using BTBAS, $NH_3$, and $N_2O$ as process gas and an $SiO_2$ film (hereinafter, referred to as a BTBAS-SiO film) formed using BTBAS and $O_2$ as process gas are similar to the BTBAS-SiN film in terms of the above-described properties, and thus the present invention may be usefully used for forming such films.

In addition, the present invention can be applied for forming other films besides such films formed using BTBAS, such as the BTBAS-SiN film, the BTBAS-SiON film, or the BTBAS-SiO film. For example, as described above, the present invention can be applied to the case of forming a DCS-SiN film, a TCS-SiN film, or an HCD-SiN film. In addition, the present invention can be applied to the case where a CVD method is used to form a film such as a polysilicon film, an amorphous silicon film, a metal film, or a metal oxide film.

In addition, the present invention is not limited to the case where a film is formed by a CVD method. The present invention can be applied to the case where a film is formed by an atomic layer deposition (ALD) method. The present invention is not limited to the case where a film is formed by a CVD method or an ALD method. For example, the present invention can be applied to the case where an oxidation or diffusion treatment is performed to a wafer.

In idle operation S6 of the above-described embodiment, while supplying $N_2$ gas to the inside of the process chamber 201 at a high flow rate, the inside of the process chamber 201 is exhausted through the slow exhaust line 232a at which the orifice 232c is installed. However, the present invention is not limited thereto. Not only in idle operation S6 but also in wafer charging operation, wafer discharging operation, boat loading operation S1, or boat unloading operation S55, the inside of the process chamber 201 can be exhausted through the slow exhaust line 232a at which the orifice 232c is installed while supplying $N_2$ gas to the inside of the process chamber 201 at a high flow rate. In this case, the same effects as those attained in the above-described embodiment can be attained.

Figure 8:
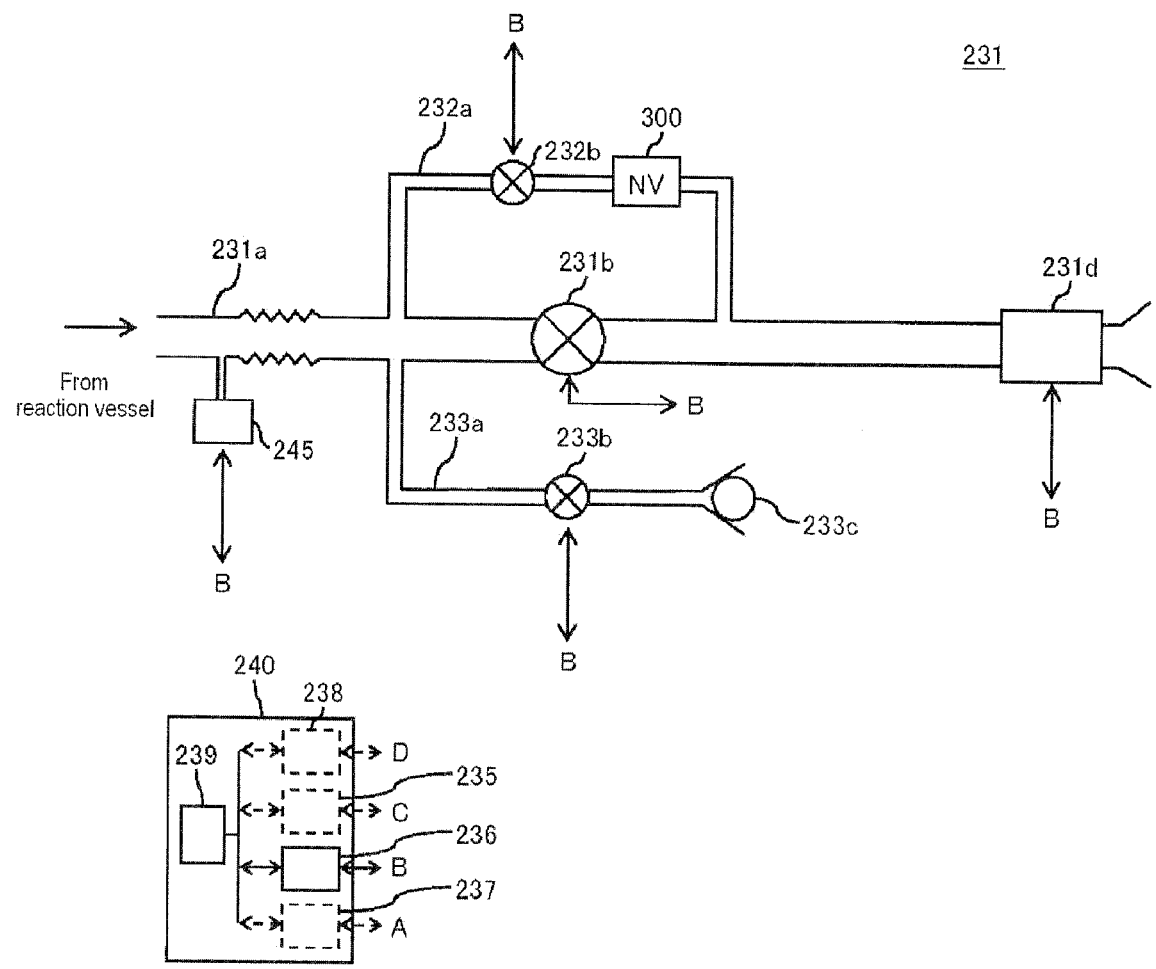
FIG. 8 is a schematic view illustrating gas exhaust lines including a main exhaust line and a slow exhaust line, as a gas exhaust system of a vertical CVD apparatus which is a substrate processing apparatus relevant to another embodiment of the present invention.

Furthermore, in the above-described embodiment, while supplying $N_2$ gas to the inside of the process chamber 201 at a high flow rate, the inside of the process chamber 201 is exhausted through the slow exhaust line 232a at which the orifice 232c is installed as a throttle part. However, as shown in FIG. 8, a needle valve 300 can be used as a throttle part instead of the orifice 232c. In the case of using the needle valve 300 as a throttle part, it is advantageous in that after the throttle part is installed at the slow exhaust line 232a, the cross sectional area of a gas passage at the throttle part can be adjusted. That is, the flow rate of gas through the throttle part can be adjusted.

Figure 9:
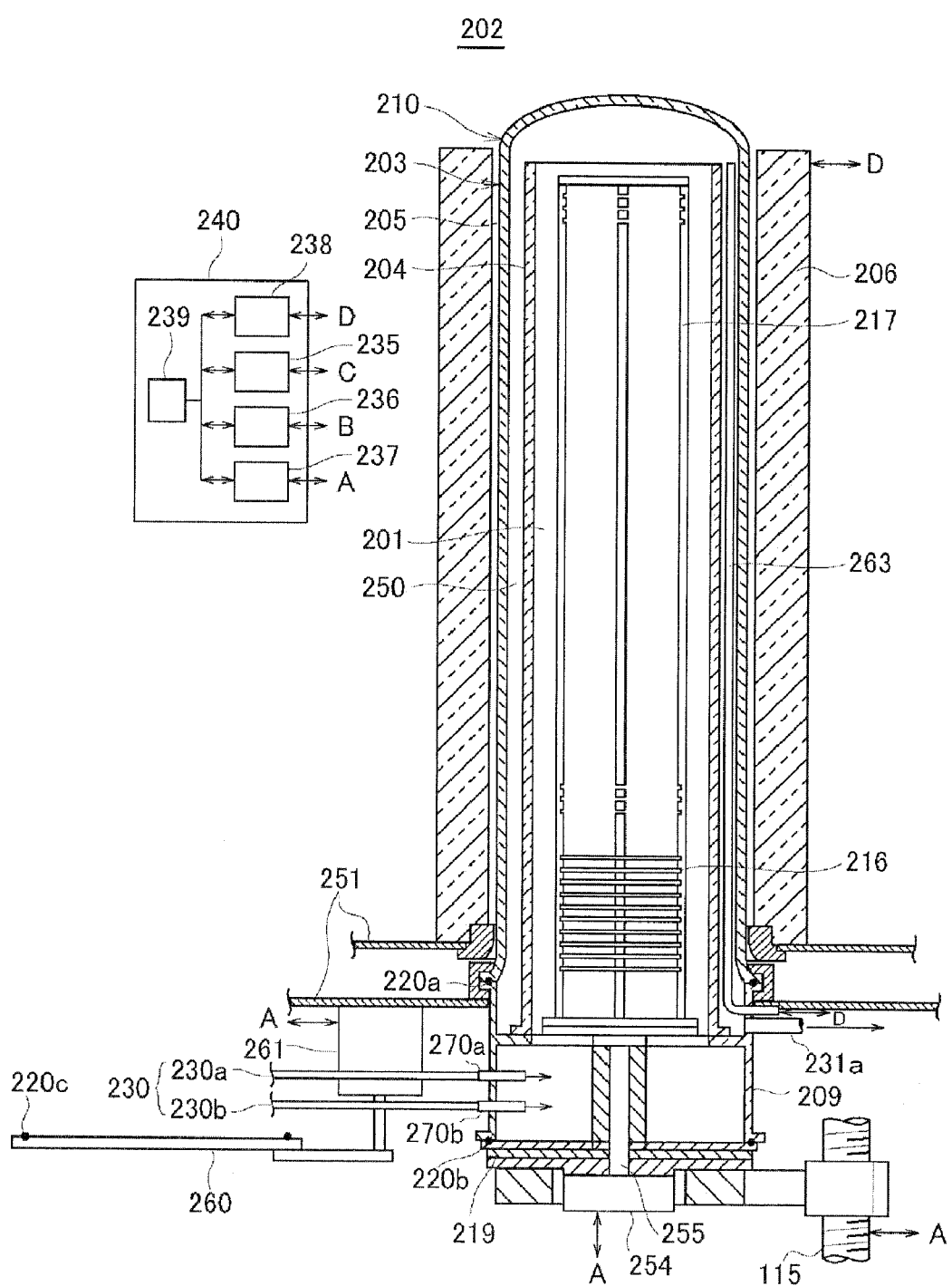
FIG. 9 is a schematic view illustrating a vertical CVD apparatus as a substrate processing apparatus relevant to another embodiment of the present invention, in which a reaction vessel accommodating an empty boat is closed by a seal cap.

Furthermore, in idle operation S6 of the above-described embodiment, idle purge is performed when the boat 217 is at an unloaded position and the opened bottom side of the manifold 209 is sealed by the shutter 260. However, as shown in FIG. 9, idle purge can be performed in a state where the boat 217 in which no wafer 200 is held is loaded in the process chamber 201 and the opened bottom side of the manifold 209 is sealed by the seal cap 219. Structurally, when the opened bottom side of the manifold 209 is sealed by the seal cap 219 than when sealed by the shutter 260, the opened bottom side of the manifold 209 can be sealed more securely with a high contact degree at a seal part, and thus a flow to an exhaust side can be firmly ensured.

Furthermore, in idle operation S6 of the above-described embodiment, while supplying $N_2$ gas to the inside of the process chamber 201 at a high flow rate, the inside of the process chamber 201 is exhausted through the slow exhaust line 232a at which the orifice 232c is installed, so as to prevent backflow of byproducts along the inside of piping or adhesion of the byproducts to the inside of the piping. However, as shown in FIG. 10A and FIG. 10B, a pipe heater 310 can be installed around the main exhaust line 231a or the slow exhaust line 232a so as to prevent backflow of byproducts along the inside of the piping or adhesion of the byproducts to the inside of the piping more reliably.

Figure 10A:
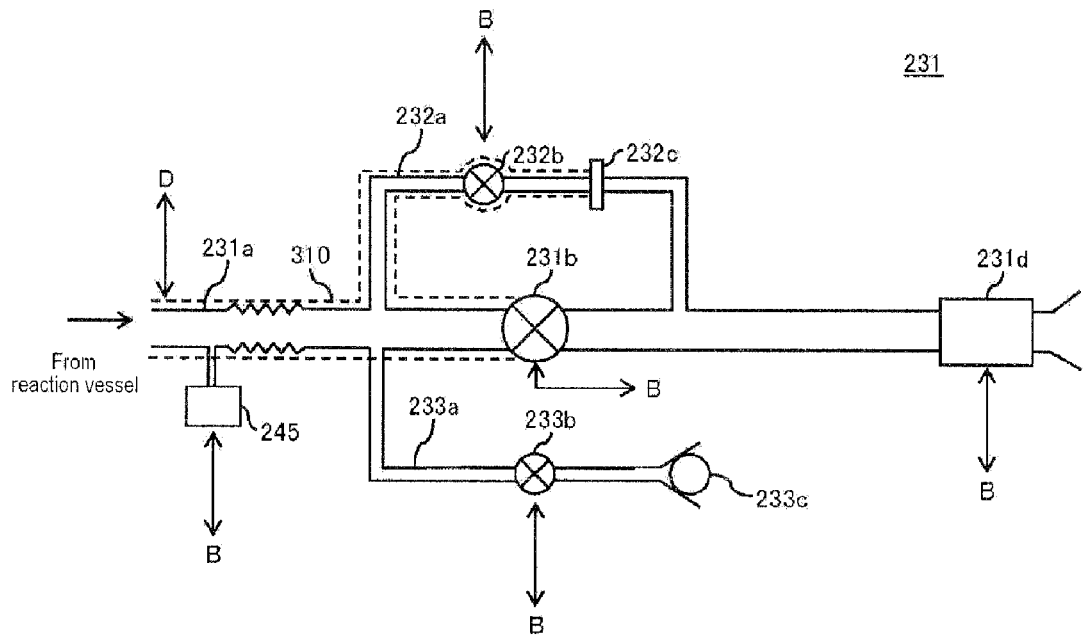
FIG. 10A and FIG. 10B are schematic views illustrating gas exhaust lines including a main exhaust line and a slow exhaust line, as a gas exhaust system of a vertical CVD apparatus which is a substrate processing apparatus relevant to another embodiment of the present invention.

In the case of FIG. 10A, the pipe heater 310 is installed along the upstream side of the main exhaust valve 231b of the main exhaust line 231a and the upstream side of the orifice 232c of the slow exhaust line 232a (that is, the pipe heater 310 is installed along an atmospheric pressure side), but not along the downstream side of the main exhaust valve 231b of the main exhaust line 231a and the downstream side of the orifice 232c of the slow exhaust line 232a (that is, the pipe heater 310 is not installed along a depressurized side). The reason for this is as follows. Byproducts such as $NH_4Cl$ can easily adhere to an atmospheric-pressure part of the exhaust line where purge is performed at atmospheric pressure; however, since gas such as $NH_4Cl$ flown from the inside of the process chamber 201 can be discharged in its gas state through a depressurized part of the exhaust line where purge is performed at a depressurized condition, adhesion of byproducts such as $NH_4Cl$ to the depressurized part can be prevented without the pipe heater 310. The pipe heater 310 may be installed at at least one of the main exhaust line 231a and the slow exhaust line 232a.

Figure 10B:
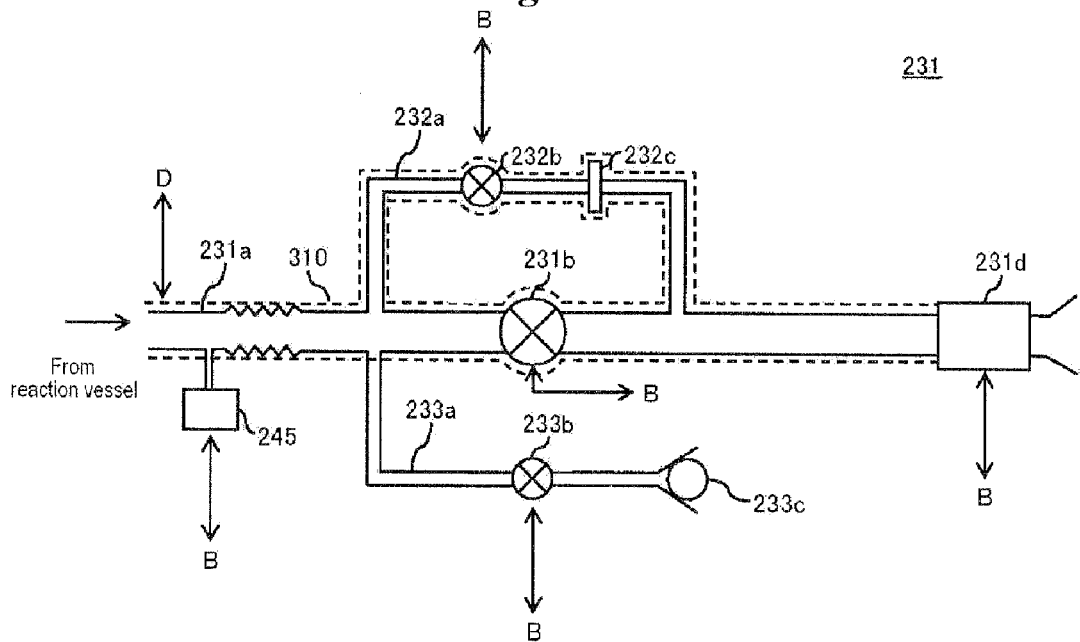

In the case of FIG. 10B, the pipe heater 310 is installed along the entire lengths of the main exhaust line 231a and the slow exhaust line 232a. In the case where the pipe heater 310 is installed along the entire length of the exhaust line, adhesion of byproducts such as $NH_4Cl$ to the inside of the exhaust line can be prevented more reliably. In addition, the pipe heater 310 can be installed along the entire length of at least one of the main exhaust line 231a and the slow exhaust line 232a.

The temperature control unit 238 is electrically connected to the pipe heater 310. The temperature control unit 238 controls power to the pipe heater 310 to keep the temperature of the piping of the exhaust line at a desired temperature, for example, 120° C. or higher. A flow of vaporized byproducts such as $NH_4Cl$ can be formed by heating the piping to 120° C. or higher (e.g., 120° C. to 200° C.), so that adhesion of the byproducts such as $NH_4Cl$ to the piping can be prevented more reliably. In addition, since gas such as $NH_4Cl$ can be discharged in its gas state, backflow of byproducts from the inside of the piping can be suppressed more reliably.

As described above, according to the substrate processing apparatus and the method of manufacturing a semiconductor device of the present invention, byproducts and components of the byproducts can be prevented from flowing back from the main exhaust line to the inside of the reaction vessel, and generation of fine contaminants having a small particle size on a substrate can be prevented.

(Supplementary Note)

The present invention also includes the following preferred embodiments.

(Supplementary Note 1)

According to a preferred embodiment of the present invention, there is provided a substrate processing apparatus including: a reaction vessel configured to process a substrate; a heater configured to heat an inside of the reaction vessel; a gas supply line configured to supply gas to the inside of the reaction vessel; a first valve installed at the gas supply line; a flow rate controller installed at the gas supply line for controlling a gas supply flow rate; a main exhaust line configured to exhaust the inside of the reaction vessel; a second valve installed at the main exhaust line; a slow exhaust line installed at the main exhaust line for bypassing the second valve; a third valve installed at the slow exhaust line; a throttle part installed at the slow exhaust line for throttling a gas flow path of the slow exhaust line; a vacuum pump installed at the main exhaust line for evacuating the inside of the reaction vessel; and a controller configured to control the valves and the flow rate controller during a period where the substrate is not processed, so as to exhaust the inside of the reaction vessel through the slow exhaust line using the vacuum pump while supplying inert gas to the inside of the reaction vessel at a flow rate higher than a total flow rate of gas supplied to the inside of the reaction vessel during a substrate processing operation.

(Supplementary Note 2)

In the substrate processing apparatus of Supplementary Note 1, it is preferable that the throttle part include an orifice, and the orifice may include a hole having a diameter in a range from 1 mm to 3 mm and forming a gas flow path.

(Supplementary Note 3)

In the substrate processing apparatus of Supplementary Note 2, it is preferable that the controller be configured to control the valves and the flow rate controller during the period where the substrate is not processed so as to exhaust the inside of the reaction vessel through the slow exhaust line using the vacuum pump while supplying inert gas to the inside of the reaction vessel at a flow rate of 5 slm to 30 slm.

(Supplementary Note 4)

In the substrate processing apparatus of Supplementary Note 1, it is preferable that a sub heater be installed at an upstream side of the second valve of the main exhaust line and/or an upstream side of the third valve of the slow exhaust line, and the controller be configured to control the sub heater so as to heat the upstream side of the second valve of the main exhaust line and/or the upstream side of the third valve of the slow exhaust line to a temperature in a range from 120° C. to 200° C.

(Supplementary Note 5)

In the substrate processing apparatus of Supplementary Note 1, it is preferable that the throttle part be configured to keep the inside of the reaction vessel at atmospheric pressure and depressurize a part of the slow exhaust line located at a downstream side of the throttle part when the controller controls the valves and the flow rate controller during the period where the substrate is not processed so as to exhaust the inside of the reaction vessel through the slow exhaust line using the vacuum pump while supplying inert gas to the inside of the reaction vessel at the flow rate higher than the total flow rate of gas supplied to the inside of the reaction vessel during the substrate processing operation (Supplementary Note 6)

In the substrate processing apparatus of Supplementary Note 1, it is preferable that the throttle part include an orifice, and the orifice include a hole forming a gas flow path, wherein a diameter of the hole is set to a size for keeping the inside of the reaction vessel at atmospheric pressure and depressurizing a part of the slow exhaust line located at a downstream side of the throttle part when the controller controls the valves and the flow rate controller during the period where the substrate is not processed so as to exhaust the inside of the reaction vessel through the slow exhaust line using the vacuum pump while supplying inert gas to the inside of the reaction vessel at the flow rate higher than the total flow rate of gas supplied to the inside of the reaction vessel during the substrate processing operation.

(Supplementary Note 7)

In the substrate processing apparatus of Supplementary Note 1, it is preferable that the period where the substrate is not processed be a period where the reaction vessel is closed after a processed substrate is carried out of the reaction vessel.

(Supplementary Note 8)

It is preferable that the substrate processing apparatus of Supplementary Note 1 further include: a holder configured to support the substrate; and a shutter configured to close the reaction vessel, wherein the period where the substrate is not processed is a period where the reaction vessel is closed by the shutter after the holder supporting a processed substrate is unloaded from the reaction vessel.

(Supplementary Note 9)

It is preferable that the substrate processing apparatus of Supplementary Note 1 further include: a holder configured to support the substrate; a seal cap configured to support the holder and close the reaction vessel; and a shutter configured to close the reaction vessel, wherein the period where the substrate is not processed is a period where the reaction vessel is closed by the shutter after the holder supporting a processed substrate is unloaded from the reaction vessel, the processed substrate is discharged from the holder, and the empty holder is reloaded in the reaction vessel.

(Supplementary Note 10)

In the substrate processing apparatus of Supplementary Note 1, it is preferable that the period where the substrate is not processed include a period where the substrate is being carried into the reaction vessel, a period where the substrate is being carried out from the reaction vessel after the substrate is processed, and a period where the reaction vessel is closed after the processed substrate is carried out from the reaction vessel.

(Supplementary Note 11)

According to another preferred embodiment of the present invention, there is provided a substrate processing apparatus including: a reaction vessel configured to process a substrate; a heater configured to heat an inside of the reaction vessel; a gas supply line configured to supply gas to the inside of the reaction vessel; a first valve installed at the gas supply line; a flow rate controller installed at the gas supply line for controlling a gas supply flow rate; a main exhaust line configured to exhaust the inside of the reaction vessel; a second valve installed at the main exhaust line; a slow exhaust line installed at the main exhaust line for bypassing the second valve; a third valve installed at the slow exhaust line; an orifice installed at the slow exhaust line and including a hole having a diameter in a range from 1 mm to 3 mm, the hole forming a gas flow path; a vacuum pump installed at the main exhaust line for evacuating the inside of the reaction vessel; and a controller configured to control the valves and the flow rate controller during a period where the substrate is not processed, so as to exhaust the inside of the reaction vessel through the slow exhaust line using the vacuum pump while supplying inert gas to the inside of the reaction vessel at a flow rate of 5 slm to 30 slm.

(Supplementary Note 12)

According to another preferred embodiment of the present invention, there is provided a method of manufacturing a semiconductor device, including: carrying a substrate into a reaction vessel of a substrate processing apparatus; processing the substrate by supplying process gas to an inside of the reaction vessel while exhausting the inside of the reaction vessel through a main exhaust line using a vacuum pump; carrying the processed substrate from the reaction vessel; and operating the substrate processing apparatus in an idle mode until another substrate is carried into the reaction vessel for next processing, wherein during a period where the processing of the substrate is not performed, the inside of the reaction vessel is exhausted using the vacuum pump through a slow exhaust line, which is installed at the main exhaust line in parallel and including a throttle part for throttling a gas flow path, while supplying inert gas to the inside of the reaction vessel at a flow rate higher than a total flow rate of gas supplied to the inside of the reaction vessel during the processing of the substrate.

What is claimed is:

1. A substrate processing apparatus comprising:
   a reaction vessel configured to process a substrate;
   a heater configured to heat an inside of the reaction vessel;
   a gas supply line configured to supply gas to the inside of the reaction vessel;
   a first valve installed at the gas supply line;
   a flow rate controller installed at the gas supply line for controlling a gas supply flow rate;

a main exhaust line configured to exhaust the inside of the reaction vessel;
a second valve installed at the main exhaust line;
a slow exhaust line installed at the main exhaust line for bypassing the second valve;
a third valve installed at the slow exhaust line;
a throttle part installed at the slow exhaust line for throttling a gas flow path of the slow exhaust line;
a vacuum pump installed at the main exhaust line for evacuating the inside of the reaction vessel; and
a controller configured to control the valves and the flow rate controller during a period where the substrate is not processed, so as to exhaust the inside of the reaction vessel through the slow exhaust line using the vacuum pump while supplying inert gas to the inside of the reaction vessel at a flow rate higher than a total flow rate of gas supplied to the inside of the reaction vessel during a substrate processing operation.

2. The substrate processing apparatus of claim 1, wherein the throttle part comprises an orifice, and the orifice comprises a hole having a diameter in a range from 1 mm to 3 mm and forming a gas flow path.

3. The substrate processing apparatus of claim 2, wherein the controller is configured to control the valves and the flow rate controller during the period where the substrate is not processed so as to exhaust the inside of the reaction vessel through the slow exhaust line using the vacuum pump while supplying inert gas to the inside of the reaction vessel at a flow rate of 5 slm to 30 slm.

4. The substrate processing apparatus of claim 1, wherein a sub heater is installed at an upstream side of the second valve of the main exhaust line and/or an upstream side of the third valve of the slow exhaust line, and
the controller is configured to control the sub heater so as to heat the upstream side of the second valve of the main exhaust line and/or the upstream side of the third valve of the slow exhaust line to a temperature in a range from 120° C. to 200° C.

5. The substrate processing apparatus of claim 1, wherein the throttle part is configured to keep the inside of the reaction vessel at atmospheric pressure and depressurize a part of the slow exhaust line located at a downstream side of the throttle part when the controller controls the valves and the flow rate controller during the period where the substrate is not processed so as to exhaust the inside of the reaction vessel through the slow exhaust line using the vacuum pump while supplying inert gas to the inside of the reaction vessel at the flow rate higher than the total flow rate of gas supplied to the inside of the reaction vessel during the substrate processing operation.

6. The substrate processing apparatus of claim 1, wherein the throttle part comprises an orifice, and the orifice comprises a hole forming a gas flow path,
wherein a diameter of the hole is set to a size for keeping the inside of the reaction vessel at atmospheric pressure and depressurizing a part of the slow exhaust line located at a downstream side of the throttle part when the controller controls the valves and the flow rate controller during the period where the substrate is not processed so as to exhaust the inside of the reaction vessel through the slow exhaust line using the vacuum pump while supplying inert gas to the inside of the reaction vessel at the flow rate higher than the total flow rate of gas supplied to the inside of the reaction vessel during the substrate processing operation.

7. The substrate processing apparatus of claim 1, wherein the period where the substrate is not processed is a period where the reaction vessel is closed after a processed substrate is carried out of the reaction vessel.

8. The substrate processing apparatus of claim 1, further comprising:
a holder configured to support the substrate; and
a shutter configured to close the reaction vessel,
wherein the period where the substrate is not processed is a period where the reaction vessel is closed by the shutter after the holder supporting a processed substrate is unloaded from the reaction vessel.

9. The substrate processing apparatus of claim 1, further comprising:
a holder configured to support the substrate;
a seal cap configured to support the holder and close the reaction vessel; and
a shutter configured to close the reaction vessel,
wherein the period where the substrate is not processed is a period where the reaction vessel is closed by the shutter after the holder supporting a processed substrate is unloaded from the reaction vessel, the processed substrate is discharged from the holder, and the empty holder is reloaded in the reaction vessel.

10. The substrate processing apparatus of claim 1, wherein the period where the substrate is not processed comprises a period where the substrate is being carried into the reaction vessel, a period where the substrate is being carried out from the reaction vessel after the substrate is processed, and a period where the reaction vessel is closed after the processed substrate is carried out from the reaction vessel.

11. A substrate processing apparatus comprising:
a reaction vessel configured to process a substrate;
a heater configured to heat an inside of the reaction vessel;
a gas supply line configured to supply gas to the inside of the reaction vessel;
a first valve installed at the gas supply line;
a flow rate controller installed at the gas supply line for controlling a gas supply flow rate;
a main exhaust line configured to exhaust the inside of the reaction vessel;
a second valve installed at the main exhaust line;
a slow exhaust line installed at the main exhaust line for bypassing the second valve;
a third valve installed at the slow exhaust line;
an orifice installed at the slow exhaust line and comprising a hole having a diameter in a range from 1 mm to 3 mm, the hole forming a gas flow path;
a vacuum pump installed at the main exhaust line for evacuating the inside of the reaction vessel; and
a controller configured to control the valves and the flow rate controller during a period where the substrate is not processed, so as to exhaust the inside of the reaction vessel through the slow exhaust line using the vacuum pump while supplying inert gas to the inside of the reaction vessel at a flow rate of 5 slm to 30 slm.

\* \* \* \* \*